United States Patent
Kaneko

(10) Patent No.: US 7,339,970 B2
(45) Date of Patent: Mar. 4, 2008

(54) SURFACE LIGHT EMITTING ELEMENT, OPTICAL MODULE, LIGHT TRANSMISSION DEVICE

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 236 days.

(21) Appl. No.: 10/886,654

(22) Filed: Jul. 9, 2004

(65) Prior Publication Data

US 2005/0056773 A1 Mar. 17, 2005

(30) Foreign Application Priority Data

Jul. 10, 2003 (JP) .............................. 2003-272890

(51) Int. Cl.
*H01S 5/00* (2006.01)

(52) U.S. Cl. ............. 372/50.21; 372/50.1; 372/50.124; 372/43.01

(58) Field of Classification Search ............. 372/50.21, 372/50.1
See application file for complete search history.

(56) References Cited

U.S. PATENT DOCUMENTS

| | | | | |
|---|---|---|---|---|
| 5,533,041 A | * | 7/1996 | Matsuda et al. ........... | 372/50.1 |
| 5,606,572 A | * | 2/1997 | Swirhun et al. ........... | 372/96 |
| 5,825,047 A | * | 10/1998 | Ajisawa et al. ........... | 257/12 |
| 6,026,108 A | | 2/2000 | Lim et al. | |
| 6,137,814 A | * | 10/2000 | Brosson et al. ........... | 372/33 |
| 6,222,202 B1 | * | 4/2001 | Babic et al. .............. | 257/85 |
| 6,320,891 B1 | * | 11/2001 | Seko ........................ | 372/50.21 |
| 6,483,862 B1 | * | 11/2002 | Aronson et al. .......... | 372/50.21 |
| 6,535,538 B1 | * | 3/2003 | Lee et al. ................. | 372/50.21 |
| 6,597,720 B2 | | 7/2003 | Kondo | |
| 2003/0035457 A1 | * | 2/2003 | Franke ...................... | 372/50 |
| 2004/0071181 A1 | * | 4/2004 | Huang ....................... | 372/106 |

FOREIGN PATENT DOCUMENTS

| | | |
|---|---|---|
| EP | 0 840 380 A2 | 5/1998 |
| JP | A 6-97597 | 4/1994 |
| JP | A 2000-101185 | 4/2000 |
| JP | A 2000-323791 | 11/2000 |
| JP | A 2001-66299 | 3/2001 |
| JP | A 2002-504754 | 2/2002 |
| WO | WO 99/43056 | 8/1999 |

* cited by examiner

*Primary Examiner*—Armando Rodriguez
*Assistant Examiner*—Phillip Nguyen
(74) *Attorney, Agent, or Firm*—Oliff & Berridge, PLC

(57) ABSTRACT

To provide a surface light emitting element capable of maintaining characteristics of the surface light emitting element and accurately detecting emitted light. A surface light emitting element includes a light emitting element part, provided on a semiconductor substrate and emitting light perpendicular to the semiconductor substrate; a light detecting part, provided on the light emitting element part; a first electrode and a second electrode, which drives the light detecting part. The light detecting part includes a second contact layer; a light absorption layer, provided on the second contact layer; and a first contact layer provided on the light absorption layer. The first contact layer includes a first light passage part; and at least one electrode coupling part, extending from the first light passage part. The first electrode is provided on the first electrode coupling part of the first contact layer.

19 Claims, 24 Drawing Sheets

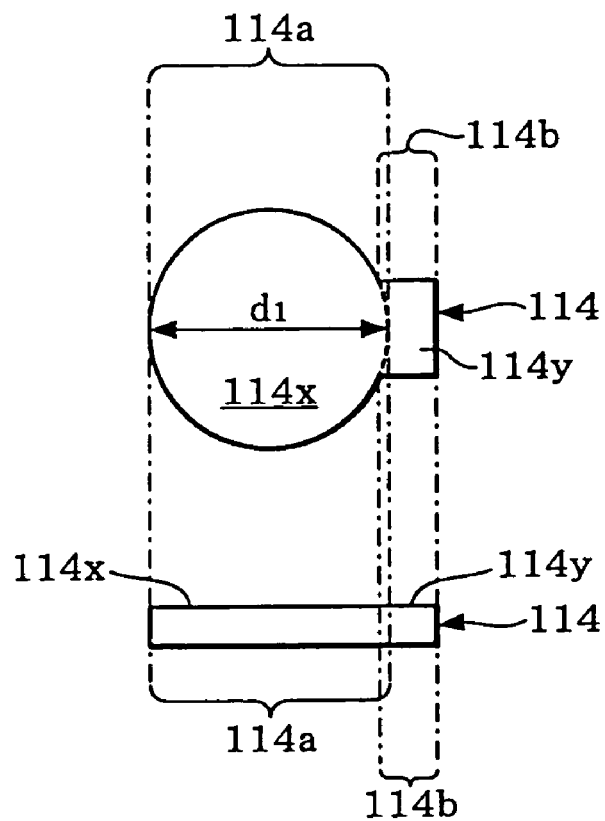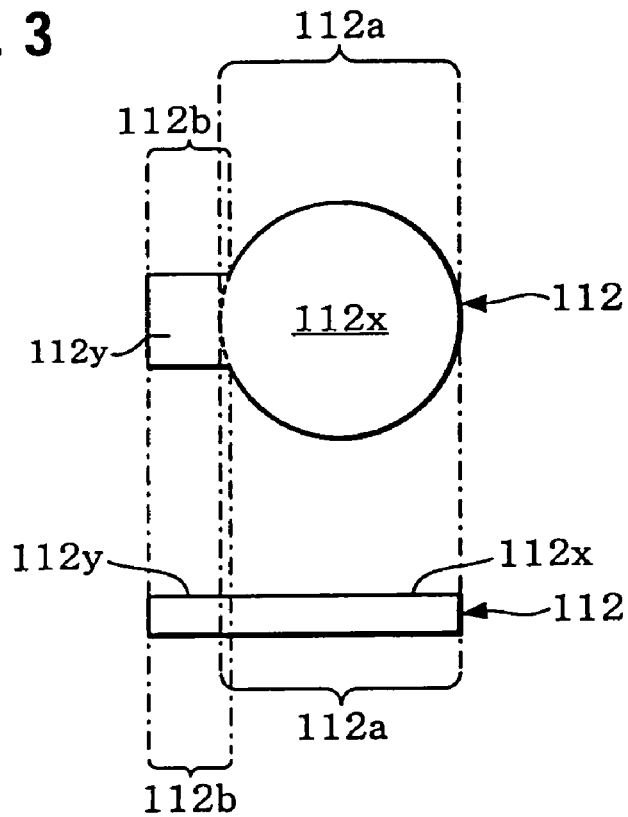

SURFACE LIGHT EMITTING ELEMENT, OPTICAL MODULE, LIGHT TRANSMISSION DEVICE

BACKGROUND OF THE INVENTION

1. Field of Invention

The present invention relates to a surface light emitting element and a manufacturing method thereof, and an optical module and a light transmission device including the surface light emitting element.

2. Description of Related Art

An optical output from a surface light emitting semiconductor laser, which is one type of surface light emitting element, varies with temperature. For this reason, in order to monitor an optical output value, an optical module employing the surface light emitting semiconductor laser may be equipped with a function to detect a portion of light emitted from the surface light emitting semiconductor laser. For example, in the related art there is a method to monitor the light intensity by mounting the surface light emitting semiconductor laser on a photo diode to detect light, and reflecting a portion of the light emitted from the surface light emitting semiconductor on a light emitting window of a package, and entering the resultant reflected light into the photo diode (see Japanese laid-open patent publication No. 2000-323791).

SUMMARY OF THE INVENTION

As for this method, however, the reflected light is influenced by the mounting accuracy between the surface light emitting semiconductor laser and the photo diode, and the shape and size of the package. For this reason, it is difficult to accurately detect only the light emitted from the surface light emitting semiconductor laser by this method. Furthermore, for this method, it is necessary to mount the surface light emitting semiconductor laser on the photo diode and to provide a light emitting window in the package in order to reflect the light emitted from the surface light emitting semiconductor laser. Therefore, it is difficult to miniaturize the module.

The present invention provides a surface light emitting element capable of maintaining characteristics of the surface light emitting element and accurately detecting emitted light.

The present invention also provides an optical module and a light transmission device including the surface light emitting element.

A surface light emitting element of an aspect of the present invention, includes a light emitting element part, provided on a semiconductor substrate and emitting light perpendicularly to the semiconductor substrate; a light detecting part, provided on the light emitting element part; and a first electrode and a second electrode, which drive the light detecting part, the light emitting element part, including: a second contact layer; a light absorption layer, provided on the upper of the second contact layer; and a first contact layer, provided on the upper of the light absorption layer, the first contact layer, including: a first light passage part; and at least one first electrode coupling part, extending from the first light passage part, the first electrode being provided on the first electrode coupling part of the first contact layer.

According to the surface light emitting element of an aspect of the present invention, the first contact layer includes the first light passage part and the first electrode coupling part, extending from the first light passage part.

The first electrode is provided on the first electrode coupling part of the first contact layer. Therefore, most of the light, passed through the light absorption layer and entered into the first light passage part, can be emitted from the upper surface of the first light passage part. Thereby, the output of the emitted light can be accurately detected.

The surface light emitting element may take, for example, the following aspects (1) through (8).

(1) The first electrode can be excluded from the upper surface of the first light passage part.

(2) The upper surface of the light detecting part can include an emitting surface of the light. An area of the emitting surface can be made substantially equal to an area of the upper surface of the first light passage part.

In this case, the emitting surface can be an upper surface of the first light passage part.

(3) The first electrode and the second electrode can be formed not to surround the light detecting part.

(4) The second contact layer includes a second light passage part and at least one second electrode coupling part, extending from the second light passage part. Only the second electrode coupling part of the second contact layer can have ohmic-contact with a second electrode to drive the light detecting part.

(5) Furthermore, at least a part of a third electrode, which drives the light emitting element part, is provided on the light emitting element part. The third electrode is provided so as to partly surround the second contact layer. Then, the first electrode and the second electrode can be excluded from a region, partly surrounded by the third electrode, and inside of a region perpendicularly above the region.

In this case, the first light passage part is of cylindrical shape, a pseudo-circle is configured by the inner side surface of the third electrode, and a diameter of the pseudo-circle can be made substantially equal to that of the cross section of the first light passage part.

(6) The light emitting element can function as a surface light emitting semiconductor laser.

(7) The light emitting element part and the light detecting part can form a pnpn-structure or an npnp-structure as a whole.

(8) The light emitting element part and the light detecting part can form a npn-structure or a pnp-structure as a whole.

Optical Module and Light Transmission Device

An optical module according to an aspect of the present invention includes the surface light emitting element and an optical wave guide. Furthermore, a light transmission device according to an aspect of the present invention includes the optical module.

BRIEF DESCRIPTION OF THE DRAWINGS

FIG. 2 shows a schematic and a cross sectional schematic explaining a first contact layer shown in FIG. 1 by enlarging;

FIG. 3 shows a schematic and a cross sectional schematic explaining a second contact layer shown in FIG. 1 by enlarging;

DETAILED DESCRIPTION OF EXEMPLARY EMBODIMENTS

Hereinafter, exemplary embodiments of the present invention will be described with reference to drawings.

First Exemplary Embodiment

1. Structure of Surface Light Emitting Element

Figure 1:
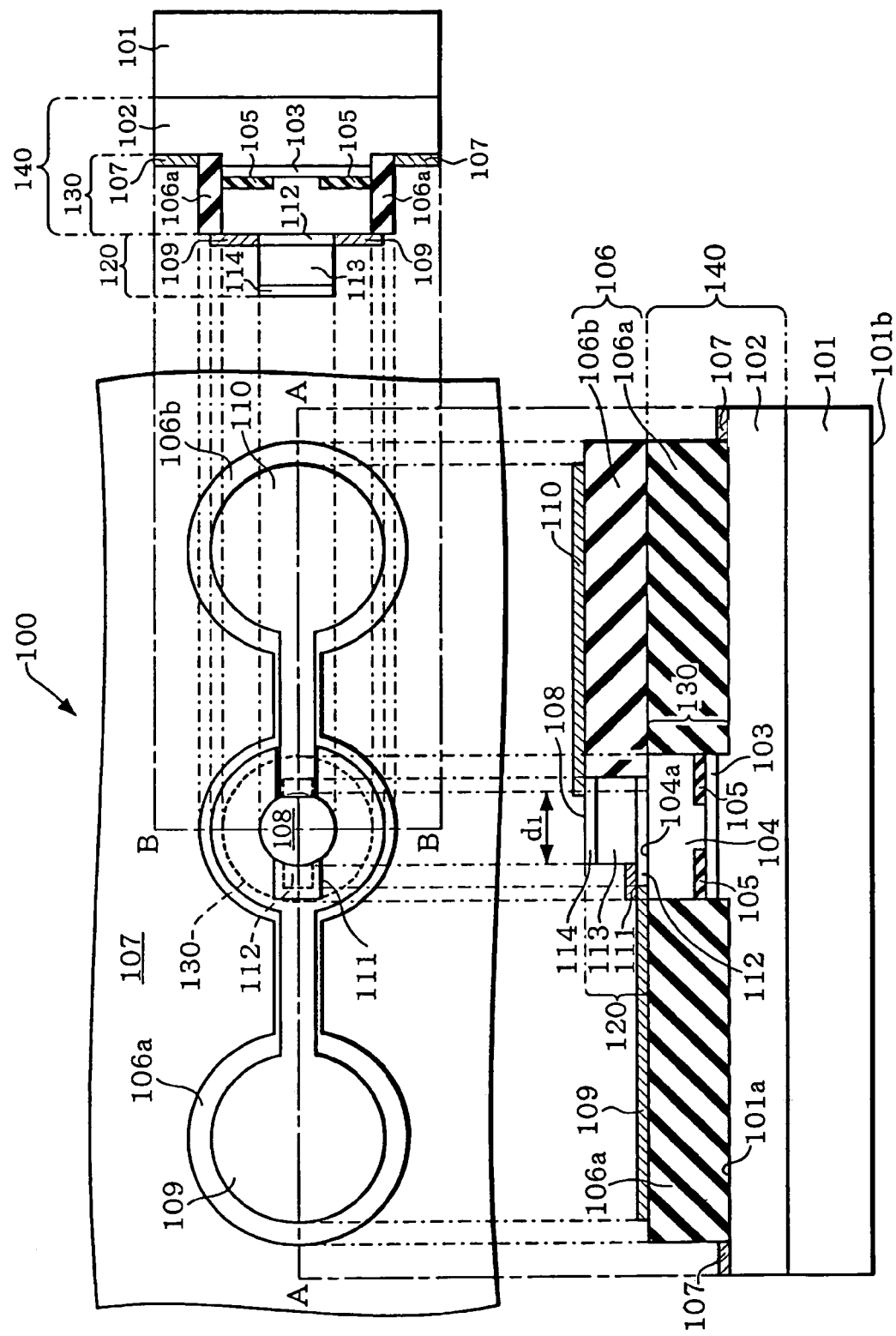
FIG. 1 shows a schematic and cross sectional schematic explaining a surface light emitting element of a first exemplary embodiment according to the present invention.
Figure 4:
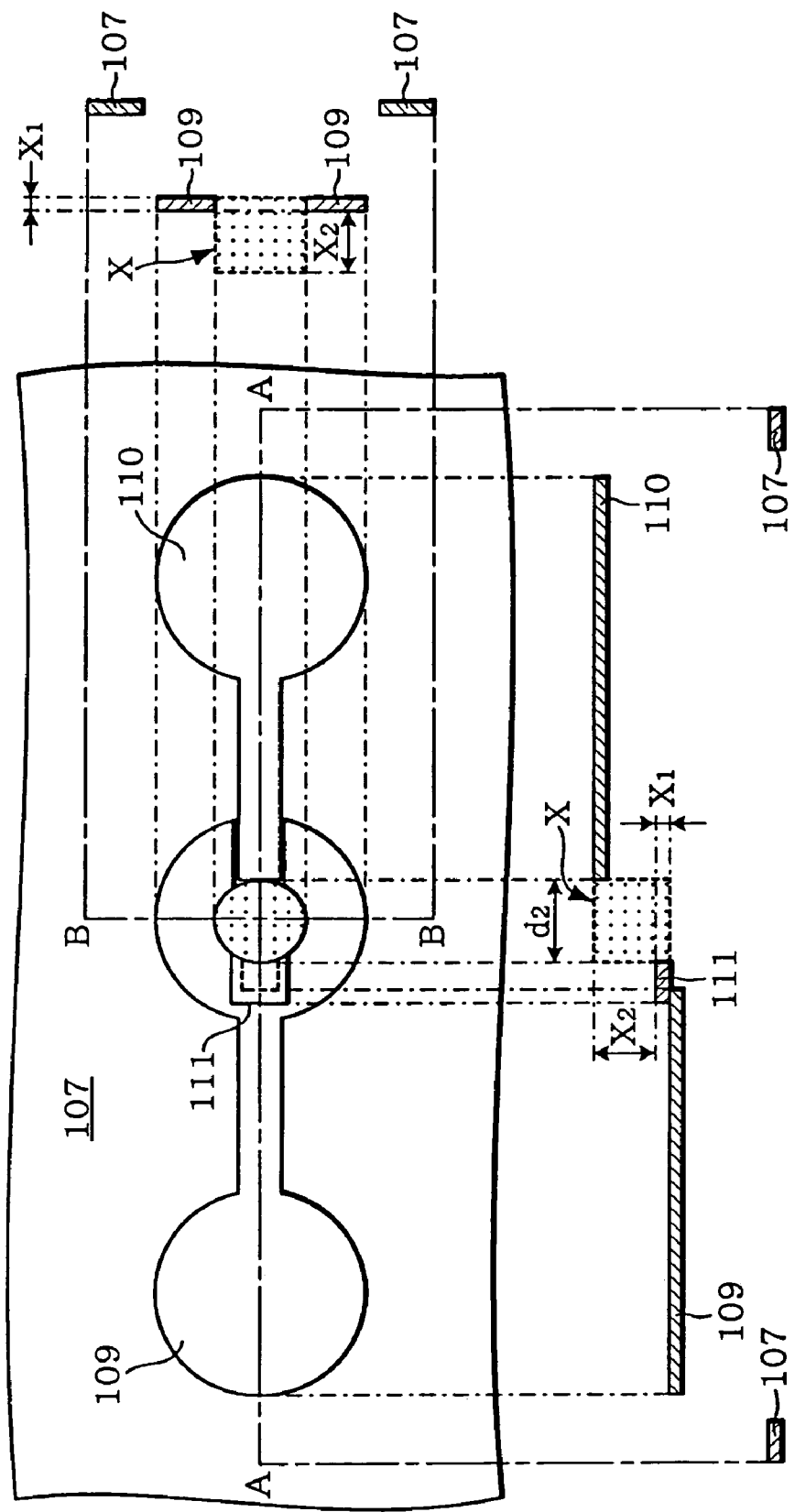
FIG. 4 shows a schematic and cross sectional schematic explaining a first electrode, a second electrode, a third electrode and a fourth electrode shown in FIG. 1 by enlarging.

FIG. 1 shows a schematic and cross-sectional schematic explaining a surface light emitting element 100 according to a first exemplary embodiment applying the present invention. In FIG. 1, a schematic and cross-sectional schematic along the A—A plane and the B—B plane of the 1 are shown. FIG. 2 shows a schematic and a cross-sectional schematic explaining the first contact layer 114 shown in FIG. 1 by enlarging. FIG. 3 shows a schematic and a cross-sectional schematic explaining the second contact layer 112 shown in FIG. 1 by enlarging. FIG. 4 shows a schematic and cross-sectional schematic explaining a first electrode 110, a second electrode 111, a third electrode 109 and a fourth electrode 107 shown in FIG. 1 by enlarging. Furthermore, in FIG. 2 and FIG. 3, only the first contact layer 114 and the second contact layer 112 are excerpted for description.

As shown in FIG. 1, the surface light emitting element 100 according to the exemplary embodiment includes a light emitting element part 140 and a light detecting part 120, provided on the light emitting element part 140. The exemplary embodiment shows a case that the light emitting element 140 functions as a surface light emitting semiconductor laser.

The surface light emitting element 100 can emit a laser beam from an emitting surface 108 vertically to a semiconductor substrate 101. The emitting surface 108 is provided on an upper surface (an upper surface 114x of a first light passage part 114a described later) of the light detecting part 120.

Hereinafter, the light emitting element part 140 and the light detecting part 120 will be described.

Light Emitting Element Part

The light emitting element part 140 is provided on the semiconductor substrate (n-type GaAs substrate for the exemplary embodiment) 101. The light emitting element part 140 includes a vertical resonator (hereinafter, "resonator"), and includes a columnar semiconductor stacked layer (hereinafter, "columnar part") 130.

For example, the light emitting element part 140 includes by sequentially depositing: forty pairs of distribution reflection type multi-layered mirror (hereinafter, "first mirror") 102, in which an n-type $Al_{0.9}Ga_{0.1}As$ layer and an n-type $Al_{0.15}Ga_{0.85}As$ layer are alternately deposited; an active layer 103, formed of a GaAs well layer and an $Al_{0.3}Ga_{0.7}As$ barrier layer and including a quantum well structure formed of three layers for the well layer; and twenty five pairs of distributing reflection type multi-layered mirror (hereinafter, "second mirror") 104, in which a p-type $Al_{0.9}Ga_{0.1}As$ layer and a p-type $Al_{0.15}Ga_{0.85}As$ layer are alternately deposited. The composition of each layer and the number of layers forming the first mirror 102, the active layer 103 and the second mirror 104 are not limited to the above condition.

The second mirror 104 is, for example, formed to be a p-type by doping C, and the first mirror 102 is, for example, formed to be an n-type by doping Si. Therefore, a pin diode is formed by the p-type second mirror 104, the active layer 103, in which impurities are not doped, and the n-type first mirror 102.

Furthermore, a portion, from the laser beam emitting side of the surface light emitting element 100 to the middle part of the first mirror 102 in the light emitting element 140, is etched in a circular shape viewing from the laser beam emitting side to form the columnar part 130. In the exemplary embodiment, the plane shape of the columnar part 130 is circular. However, the shape can take any shape.

Furthermore, a current aperture 105 made of aluminum oxide is formed in a region in a proximity of the active layer 103, one of the layers forming the second mirror 104. The current aperture 105 is formed in a ring shape. That is, the current aperture 105 has a coaxial circular shape of a cross section when the current aperture 105 is cut in a plane face parallel to a surface 101a of the semiconductor substrate 101 shown in FIG. 1.

Furthermore, as for the surface light emitting element 100 according to the exemplary embodiment, an insulating layer (first insulating layer 106a) is formed so as to cover the sides of the columnar part 130 and the upper surface of the first mirror 102. The side wall of the columnar part 130 is surrounded by the first insulating layer 106a. For example, the first insulating layer 106a can be made of polyimide resin, fluorocarbon resin, acrylic resin or epoxy resin. Polyimide resin or fluorocarbon resin may be used from the viewpoint of the easiness of machining or insulation.

Furthermore, the light emitting element part 140 is provided with the third electrode 109 and the fourth electrode 107. The third electrode 109 and the fourth electrode 107 are used to drive the light emitting element part 140. At least a part of the third electrode 109 is provided on the light emitting element 140. Specifically, as shown in FIG. 1, the third electrode 109 is provided on the columnar part 130 and the first insulating layer 106a. As shown in FIG. 1, the third electrode 109 is provided so as to partially surround the second contact layer 112. The third electrode 109 does not completely surround the second contact layer 112. The fourth electrode 107 is provided on the region of the upper surface of the first mirror 102 where the first insulating layer 106a is not provided. The exemplary embodiment shows a case that the fourth electrode 107 is provided on the first mirror 102. However, the fourth electrode 107 may be provided on a back surface 101b of the semiconductor substrate 101. This is also similar in a case of a second exemplary embodiment and a third exemplary embodiment described later.

The third electrode 109 is, for example, formed of stacked layers of Pt, Ti and Au. Furthermore, the fourth electrode 107 is, for example, formed of stacked layers of an alloy of Au and Ge, and Au. Current flows into the active layer 103 through the third electrode 109 and the fourth electrode 107. Materials to form the third electrode 109 and the fourth electrode 107 are not limited to the above-mentioned materials, but an alloy of Au and Zn can be used, for example.

Light Detecting Part

The light detecting part 120 includes a second contact layer 112, a light absorption layer 113, and a first contact layer 114. The light absorption layer 113 is provided on the second contact layer 112, and the first contact layer 114 is provided on the light absorption layer 113.

The second contact layer 112 is, for example, formed of an n-type GaAs layer, the light absorption layer 113 is, for example, formed of a GaAs layer, in which impurities are not doped. The first contact layer 114, for example, can be formed of a p-type GaAs layer. Furthermore, the second contact layer 112 is, for example, formed to be a p-type by doping C. The first contact layer 114 is, for example, formed to be a n-type by doping Si. Accordingly, a pin diode is formed by the n-type second contact layer 112, the light absorption layer 113, in which impurities are not doped, and the p-type first contact layer 114.

The first electrode 110 and the second electrode 111 are provided in the light detecting part 120. The first electrode 110 and the second electrode 111 are used to drive the light detecting part 120. The first electrode 110 and the second electrode 111 do not surround the light detecting part 120. As for the surface light emitting element 100 of the exemplary embodiment, the first electrode 110 can be formed of the same material as that of the third electrode 109. The second electrode 111 can be formed of the same material as that of the fourth electrode 107.

Furthermore, as shown in FIG. 4, the first electrode 110 and the second electrode 111 are excluded from inside of a region X. That is, the first electrode 110 and the second electrode 111 are not provided in the region X. The region X is formed by a region $X_1$, partially surrounded by the third electrode 109. A region $X_2$, vertically above the region $X_1$ (refer to FIG. 4). As shown in FIG. 4, a region shown by dots is the region X.

As shown in FIG. 2, the first contact layer 114 includes a first light passage part 114a and at least one first electrode coupling part 114b. The first electrode coupling part 114b extends from the first light passage part 114a. Furthermore, as shown in FIG. 1, the first electrode 110 is provided only on the first electrode coupling part 114b (on an upper surface 114y of the first electrode coupling part 114b) of the first contact layer 114. That is, only the first electrode coupling part 114b of the first contact layer 114 ohmic-contacts with the first electrode 110, which drives the light detecting part 120. Accordingly, the first electrode 110 is excluded from the upper surface 114x of the first light passage part 114a.

As shown in FIG. 1, the first light passage part 114a is of cylindrical shape. Furthermore, the third electrode 109 partially surrounds a periphery of the second contact layer 112, and a pseudo-circle is configured by the inner side surface of the third electrode 109. A diameter d2 of the pseudo-circle (refer to FIG. 4) is substantially equal to a diameter d1 (refer to FIG. 1 and FIG. 2) of the cross section of the first light passage part 114a.

As shown in FIG. 3, the second contact layer 112 includes a second light passage part 112a and at least one second electrode coupling part 112b. The second electrode coupling part 112b extends from the second light passage part 112a. As shown in FIG. 1, the second electrode coupling part 112b may be provided in a position where the second electrode coupling part 112b does not overlap two-dimensionally with the first electrode coupling part 114b of the first contact layer 114.

Furthermore, the second electrode 111 is provided only on the second electrode coupling part 112b (on an upper surface 112y of the second electrode coupling part 112b) of the second contact layer 112. The second electrode 111 is excluded from an upper surface 112x of the second light passage part 112a. Furthermore, only the second electrode coupling part 112b of the second contact layer 112 ohmic-contacts with the second electrode 111, which drives the light detecting part 120.

The setting position and area for the cross section of the second light passage part 112a may be adjusted so that the light, emitted from the light emitting element part 140 (specifically, the upper surface 104a of the second mirror 104), can enter into the light detecting part 120 as much as possible. The setting position and area of the cross section of the second light passage part 112a may be adjusted so that most of the light, emitted from the upper surface 104a of the second mirror 104, can enter the second light passage part 112a.

Furthermore, the upper surface of the light detecting part 120 includes the emitting surface 108 of the light. Specifically, the upper surface 114x of the first light passage part 114a of the first contact layer 114 is the emitting surface 108. In this case, as shown in FIG. 1, an area of the emitting surface 108 is substantially equal to that of the upper surface 114x of the first light passage part 114a.

Furthermore, as shown in FIG. 1, the first electrode 110 is formed on the first electrode coupling part 114b and a second insulating layer 106b, and the second insulating layer 106b is formed on the first insulating layer 106a. As shown in FIG. 1, as for the light detecting part 120, the side wall of the first electrode coupling part 114a of the first contact layer 114, a part of the side wall of the light absorption layer 113, and the side wall of the second electrode coupling part 112b of the second contact layer 112 contact with the second insulating layer 106b.

The second insulating layer 106b, for example, can be formed of silicone nitride, silicone oxide or silicon oxide nitride. An insulating layer 106 is formed of the first insulating layer 106a and the second insulating layer 106b.

The exemplary embodiment shows a case that the insulating layer 106 is formed of the first insulating layer 106a and the second insulating layer 106b. However, the insulating layer 106 is not limited to a two-layer structure, but may be formed by patterning one layer made of the same material, for example.

Overall Configuration

As for the surface light emitting element 100 of the exemplary embodiment, a pnpn-structure as a whole is formed by the n-type first mirror 102 and the p-type second mirror 104 in the light emitting element part 140, and the n-type first contact layer 114 and the p-type second contact layer 112 in the light detecting part 120. In addition, an npnp-structure as a whole may also be formed by exchanging the p-type and the n-type in the above-mentioned each layer.

The light detecting part 120 has a function to monitor an optical output generated in the light emitting element part 140. Specifically, the light detecting part 120 converts the light generated in the light emitting element part 140 into current. The optical output generated in the light emitting element part 140 is computed based on the current value.

Specifically, in the light detecting part 120, a portion of the light generated by the light emitting element part 140 is absorbed by the light absorption layer 113. Light excitation is generated by the absorbed light and then electrons and positive holes are generated. Then, the electrons move to the second electrode 111, and the positive holes move to the first electrode 110, respectively, by the electrical field applied from the outside of the element. As a result, in the light detecting part 120, current is generated in a direction from the second contact layer 112 to the first contact layer 114.

Furthermore, an optical output from the light emitting element part 140 is primarily determined by a bias voltage applied to the light emitting element part 140. In particular, when the light emitting element part 140 is a surface light emitting semiconductor laser, the optical output from the light emitting element part 140 changes greatly depending on ambient temperature of the light emitting element part 140 and the age of the light emitting element part 140. For this reason, it is necessary to maintain a predetermined optical output for the light emitting element part 140 by adjusting the current value flowing in the light emitting element part 140 by monitoring the optical output from the light emitting element part 140 with the light detecting part 120 and adjusting the voltage value applied to the light emitting element part 140 based on the current value generated in the light detecting part 120. A control to feedback the optical output of the light emitting element part 140 to the voltage value applied to the light emitting element part 140 can be performed by using an external electronic circuit (not shown).

The exemplary embodiment has explained a case that the surface light emitting element 100 is a surface light emitting semiconductor laser. However, the present invention is also applicable to light emitting elements other than the surface light emitting semiconductor laser. As for the surface light emitting element applying the present invention, a semiconductor light emitting diode can be used, for example. This can be similarly applied to surface light emitting elements according to a second exemplary embodiment and a third exemplary embodiment described later.

2. Operation of the Surface Light Emitting Element

Hereinafter, general operation of the surface light emitting element 100 according to the exemplary embodiment will be described. The following driving method of the surface light emitting semiconductor laser is one example, and various modifications can be made without departing from the spirit of the present invention.

At first, when a voltage in a forward direction is applied to the pin diode by the third electrode 109 and the fourth electrode 107, electrons and positive holes recombine in the active layer 103. Then the light is emitted by recombination. When the emitted light shuttles between the second mirror 104 and the first mirror 102, an induced emission is generated, and the light intensity is amplified. If the light gain outweighs the light loss, a laser oscillation is generated, and laser beam is emitted from the upper surface 104a of the second mirror 104 and enters the second contact layer 112 (second light passage part 112b) of the light detecting part 120.

Next, in the light detecting part 120, the light entered to the second contact layer 112 (second light passage part 112b) enters the light absorption layer 113 next. Because a portion of the entered light is absorbed by the light absorption layer 113, light excitation is generated in the light absorption layer 113, and electrons and positive holes are generated. Then, the electrons move to the second electrode 111, and the positive holes move to the first electrode 110, respectively, by the electrical field applied from the outside of the element. As a result, in the light detecting part 120, current (photo-electric current) is generated in a direction from the second contact layer 112 to the first contact layer 114. The optical output of the light emitting element part 140 can be detected by measuring the current value.

3. A Method of Manufacturing the Surface Light Emitting Element

Next, a method of manufacturing the surface light emitting element according to the first exemplary embodiment applying the present invention will be described with reference to FIGS. 5 through 14. FIGS. 5 through 14 show schematics and cross sectional schematics explaining one manufacturing process of the surface light emitting element 100 shown in FIG. 1, and correspond to the schematic and cross sectional schematic shown in FIG. 1.

Figure 5:
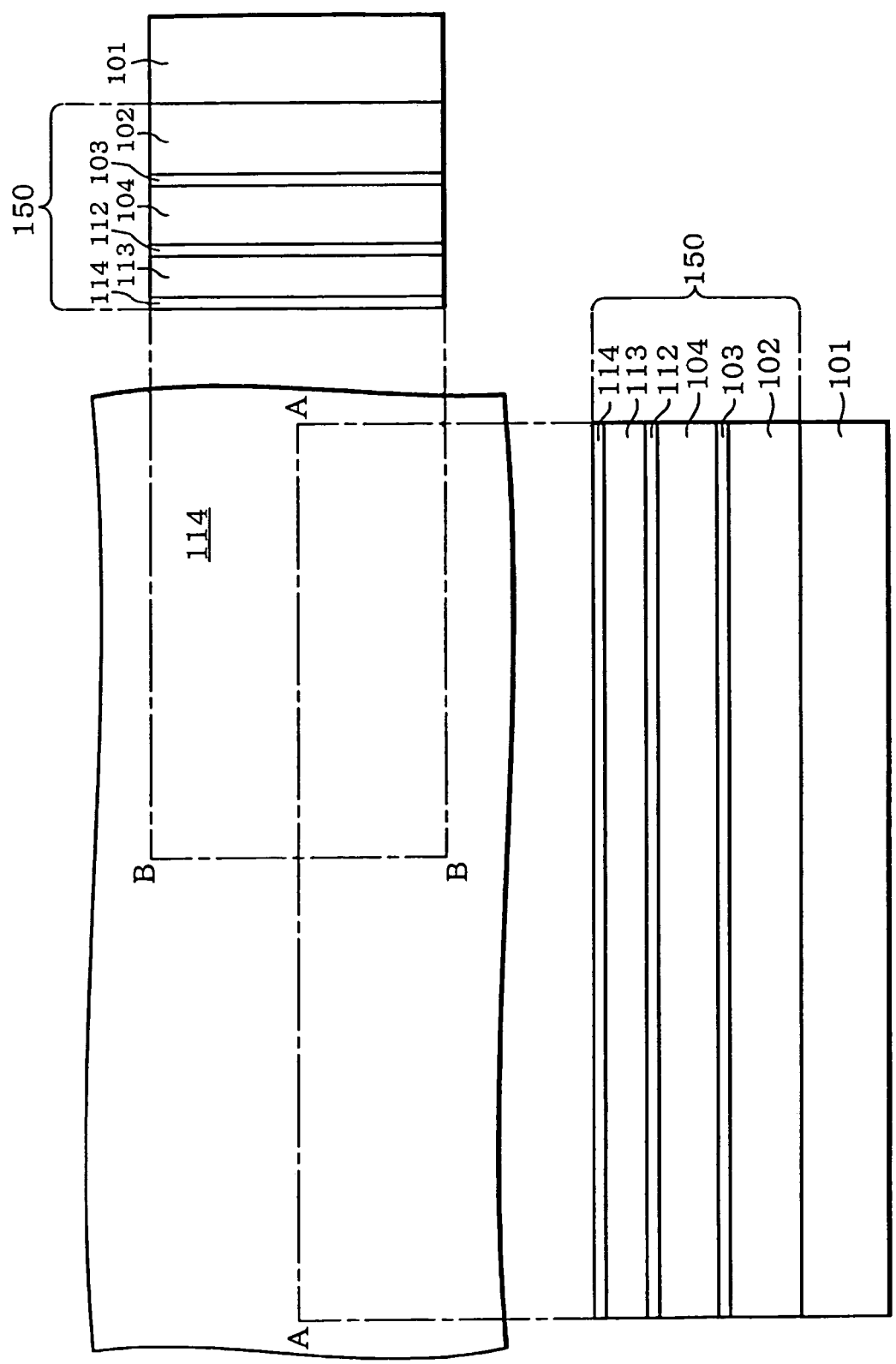
FIG. 5 shows a schematic and cross sectional schematic explaining a manufacturing process of the surface light emitting element shown in FIG. 1.

(1) At first, as shown in FIG. 5, a semiconductor multi-layer 150 is formed by growing compositions epitaxially while changing them on the surface of the semiconductor substrate made of n-type GaAs (refer to FIG. 5). The semiconductor multi-layer 150 is formed of forty pairs of the first mirror 102, in which an n-type $Al_{0.9}Ga_{0.1}As$ layer and an n-type $Al_{0.15}Ga_{0.85}As$ layer are alternately deposited, an active layer 103, formed of a GaAs well layer and an $Al_{0.3}Ga_{0.7}As$ barrier layer and including a quantum well structure formed of three layers for the well layer, twenty five pairs of the second mirror 104, in which a p-type $Al_{0.9}Ga_{0.1}As$ layer and a p-type $Al_{0.15}Ga_{0.85}As$ layer are alternately deposited, the second contact layer 112, formed of n-type GaAs, the light absorption layer 113, formed of GaAs in which impurities are not doped, and the first contact layer 114, formed of p-type GaAs. The semiconductor multi-layer 150 is formed by sequentially depositing these layers on the semiconductor substrate 101.

When the second mirror 104 is grown, at least one layer in proximity of the active layer 103 is formed on an AlAs layer or an AlGaAs layer whose Al composition is 0.95 or more. The layer is oxidized later and becomes the current aperture 105 (refer to FIG. 9). In addition, when the second electrode 111 and the third electrode 109 is formed in the later process, at least a proximity of a part of the second contact layer 112, which contacts the second electrode 111, may easily make an ohmic-contact with the second electrode 111 by increasing the carrier density. In a similar way, at least a proximity of a part of the second mirror 104, which contacts the third electrode 109, may easily make an ohmic-contact with the third electrode 109 by increasing the carrier density.

The temperature when carrying out the epitaxial growth is appropriately determined by a growth method and the raw material, a type of the semiconductor substrate 101, and a type, thickness and carrier density of the semiconductor multi-layer 150 to be formed. However, it is preferably from 450° C. to 800° C. in general. Additionally, the time required to carry out the epitaxial growth is appropriately determined in the similar way as the temperature. As for a method to carry out the epitaxial growth, the MOVPE (Metal-Organic Vapor Phase Epitaxy) method, the MBE (Molecular Beam Epitaxy) method or the LPE (Liquid Phase Epitaxy) method can be used.

Figure 6:
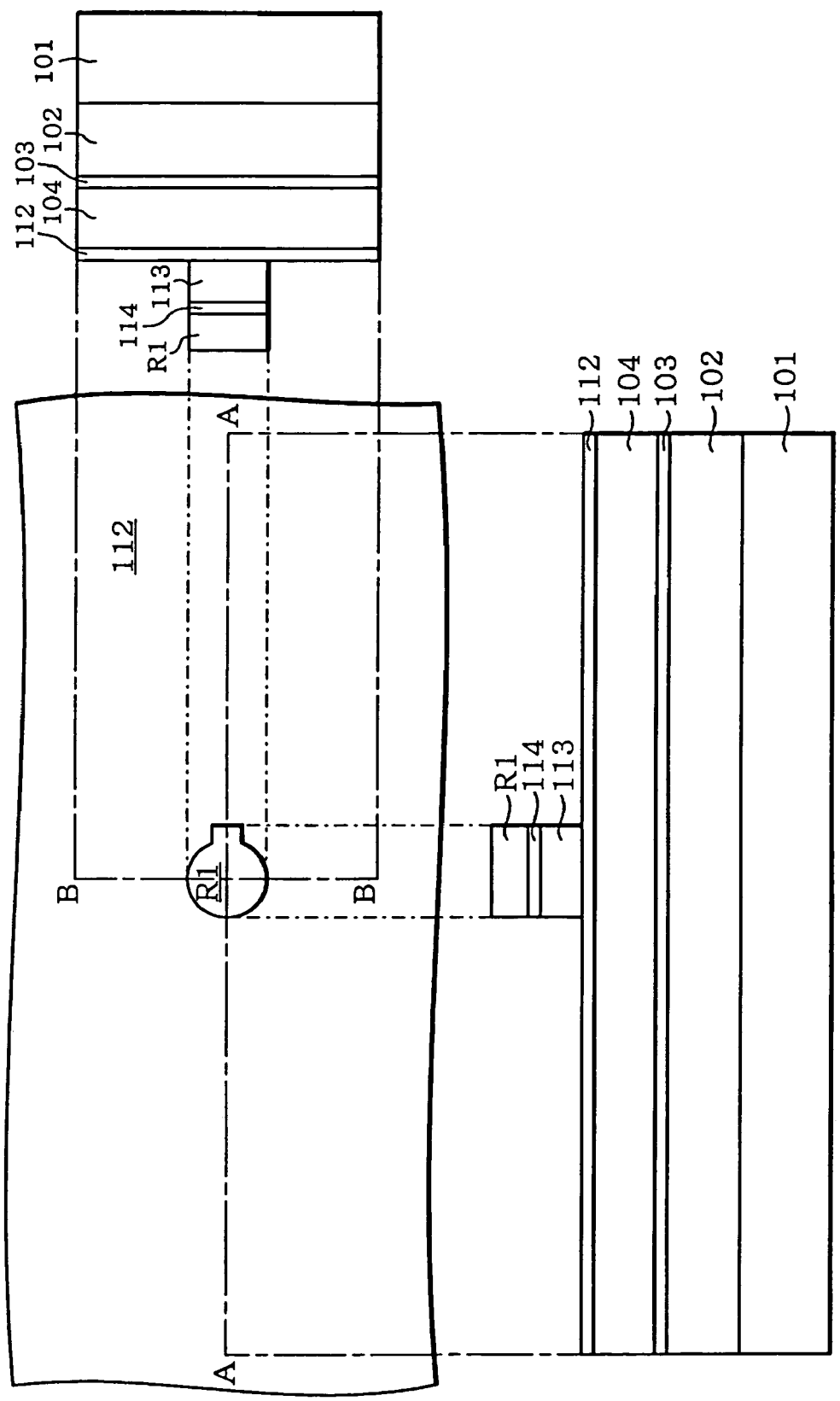
FIG. 6 shows a schematic and cross sectional schematic explaining a manufacturing process of the surface light emitting element shown in FIG. 1.

(2) Next, each of the first contact layer 114 and the light absorption layer 113 is patterned to a predetermined shape (refer to FIG. 6).

At first, after applying photo resist (not shown) on the semiconductor multi-layer 150, a resist layer R1 having a predetermined pattern is formed by patterning the photo resist by the photo lithography method.

Then, the first contact layer 114 and the light absorption layer 113 are etched, for example, by the dry etching method using the resist layer R1 as a mask. With this process, as shown in FIG. 6, the first contact layer 114 (refer to FIG. 2), formed of the first light passage part 114a and the first electrode coupling part 114b, and the light absorption layer 113 having the same plane shape as the first contact layer 114 are formed. After that, the resist layer R1 is removed.

Figure 7:
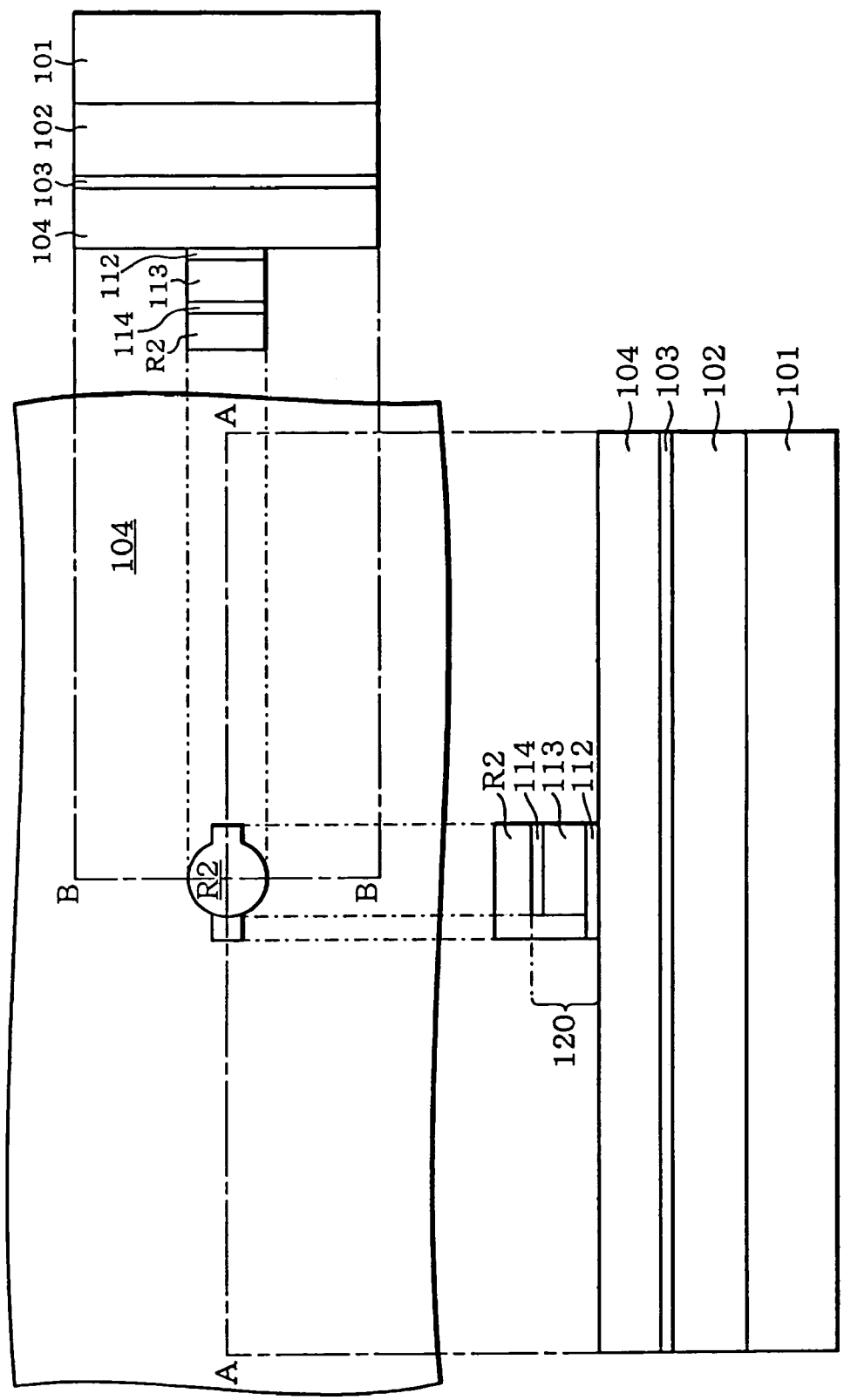
FIG. 7 shows a schematic and cross sectional schematic explaining a manufacturing process of the surface light emitting element shown in FIG. 1.

(3) Next, the second contact layer 112 is patterned to a predetermined shape (refer to FIG. 7). Specifically, at first, after applying photo resist (not shown) on the second contact layer 112, a resist layer R2 having a predetermined pattern is formed by patterning the photo resist by the photo lithography method (refer to FIG. 7).

Then, the second contact layer 112 is etched, for example, by the dry etching method using the resist layer R2 as a mask. With this process, as shown in FIG. 7, the second contact layer 112 (refer to FIG. 3), formed of the second light passage part 112a and the second electrode coupling part 112b, is formed. The second electrode coupling part 112b is formed on a position where the second electrode coupling part 112b does not overlap two-dimensionally with the first electrode coupling part 114b of the first contact layer 114. After that, the resist layer R2 is removed. With this process, only the second electrode coupling part 112b of the second contact layer 112 is exposed. At the same time, the light detecting part 120 is formed.

Figure 8:
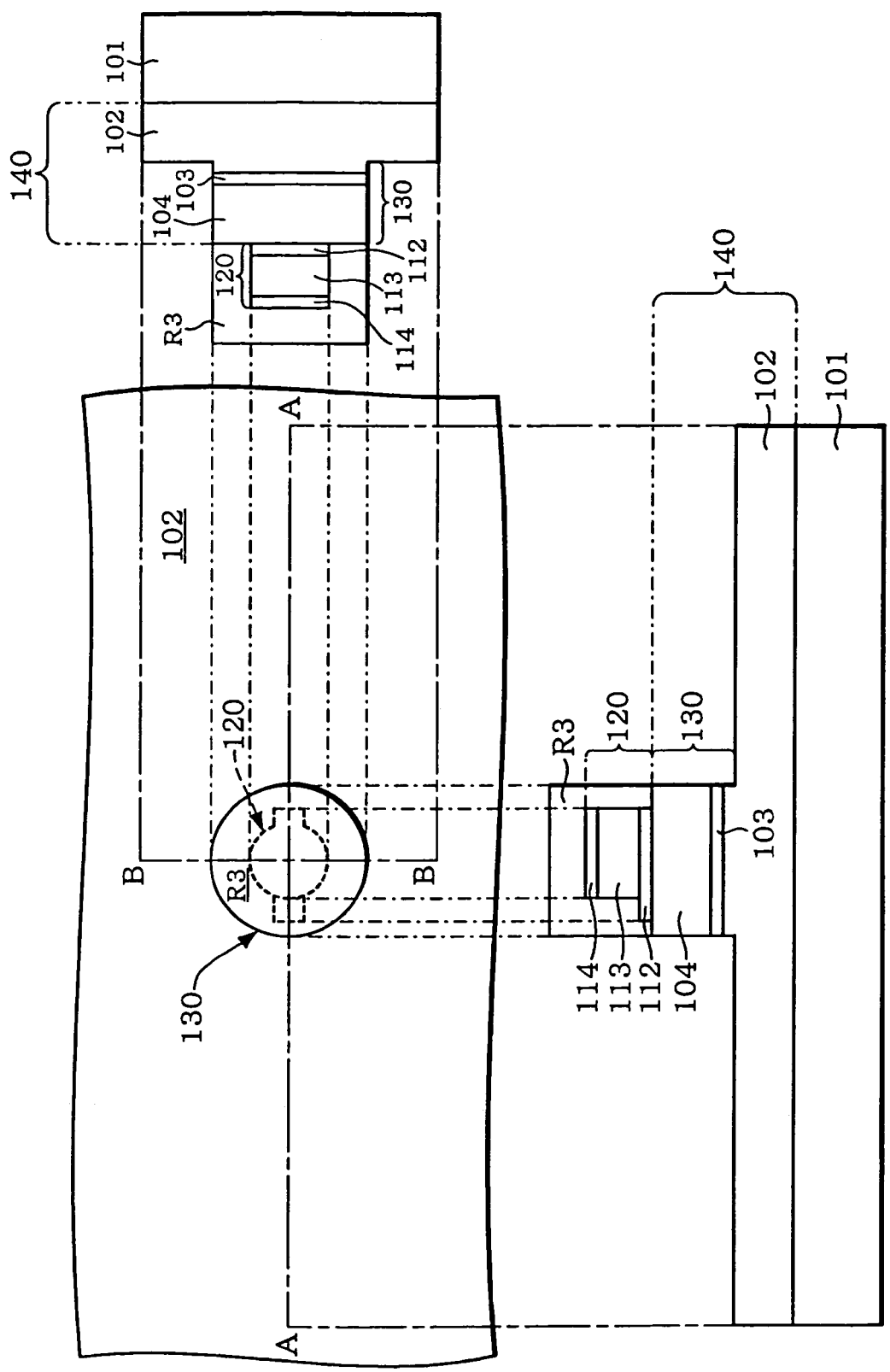
FIG. 8 shows a schematic and cross sectional schematic explaining a manufacturing process of the surface light emitting element shown in FIG. 1.

(4) Next, the columnar part 130 is formed by patterning (refer to FIG. 8). Specifically, at first, after applying photo resist (not shown) on the second mirror 104, a resist layer R3 having a predetermined pattern is formed by patterning the photo resist by the photo lithography method (refer to FIG. 8).

Then, the second mirror 104, the active layer 103 and a part of the first mirror 102 are etched, for example, by the dry etching method using the resist layer R3 as a mask. With this process, as shown in FIG. 8, the columnar part 130 is formed. With the above process, as shown in FIG. 4, the resonator (light emitting element part 140) including the columnar part 130 is formed on the semiconductor substrate 101. After that, the resist layer R3 is removed.

The exemplary embodiment has described a case that the light detecting part 120 is formed at first and then the columnar part 130 is formed. However, the columnar part 130 may be formed at first and then the light detecting part 120 may be formed.

Figure 9:
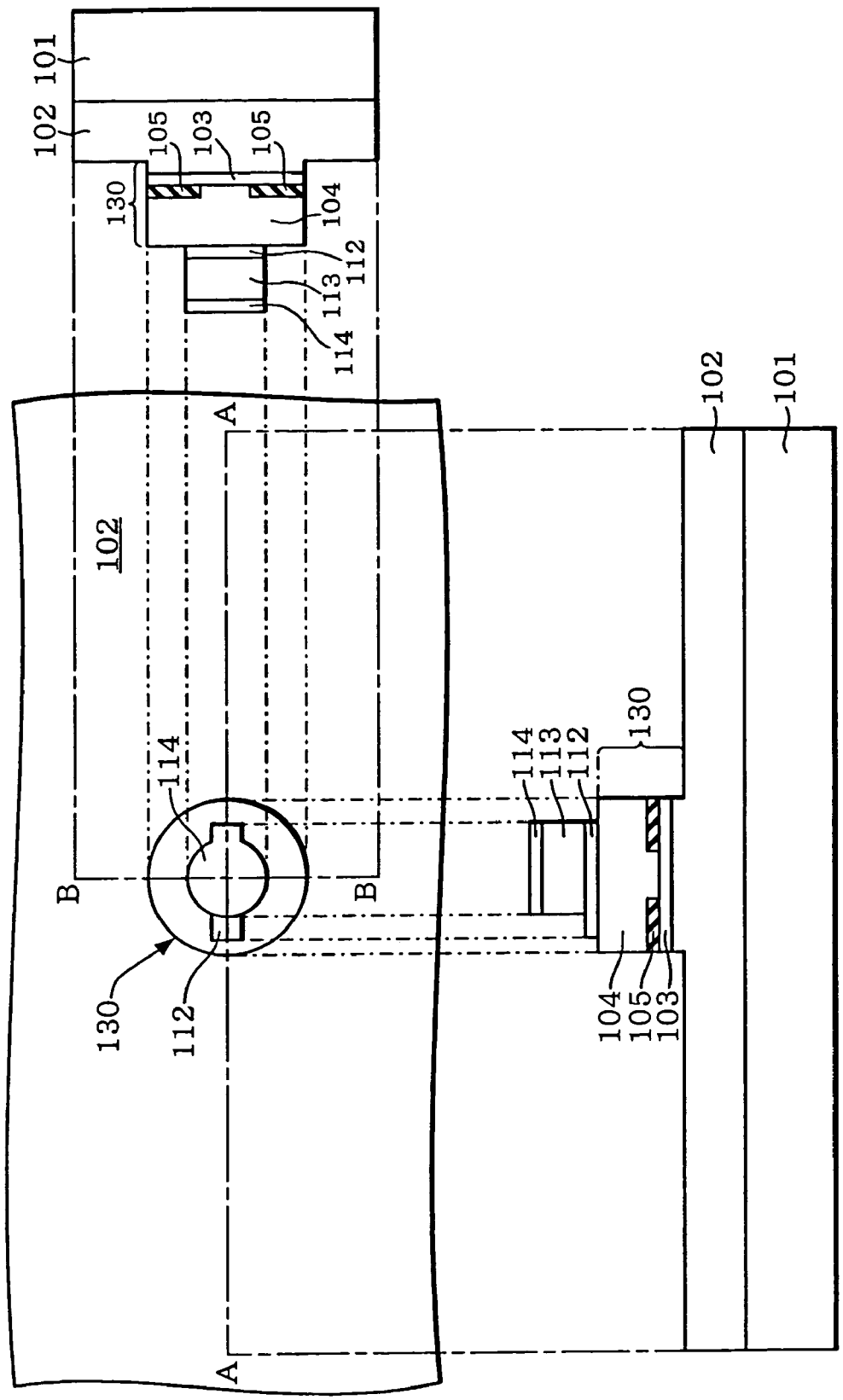
FIG. 9 shows a schematic and cross sectional schematic explaining a manufacturing process of the surface light emitting element shown in FIG. 1.

(5) Next, by putting the semiconductor substrate 101, in which the columnar part 130 is formed by the above process, into water vapor atmosphere of approximately 400° C., for example, the layers in the above-mentioned second mirror 104, which have a high concentration of Al composition, are oxidized from the side, and the current aperture 105 is formed (refer to FIG. 9).

The oxidation rate depends on the furnace temperature, vapor supply amount, and Al composition and a thickness of layer to be oxidized (the layer having a high concentration of Al composition). As for a surface light emitting laser provided with the current aperture formed by oxidation, current flows only in a portion where the current aperture is not formed (a portion, which is not oxidized). Accordingly, current density can be controlled by controlling the range of the current aperture 105 to be formed in the process of forming the current constriction by oxidation.

In addition, a diameter of the current aperture 105 may be adjusted so that most of the light, emitted from the light emitting element part 140, enters the second contact layer 112 (the second light passage part 112a of the second contact layer 112 for the exemplary embodiment).

Figure 10:
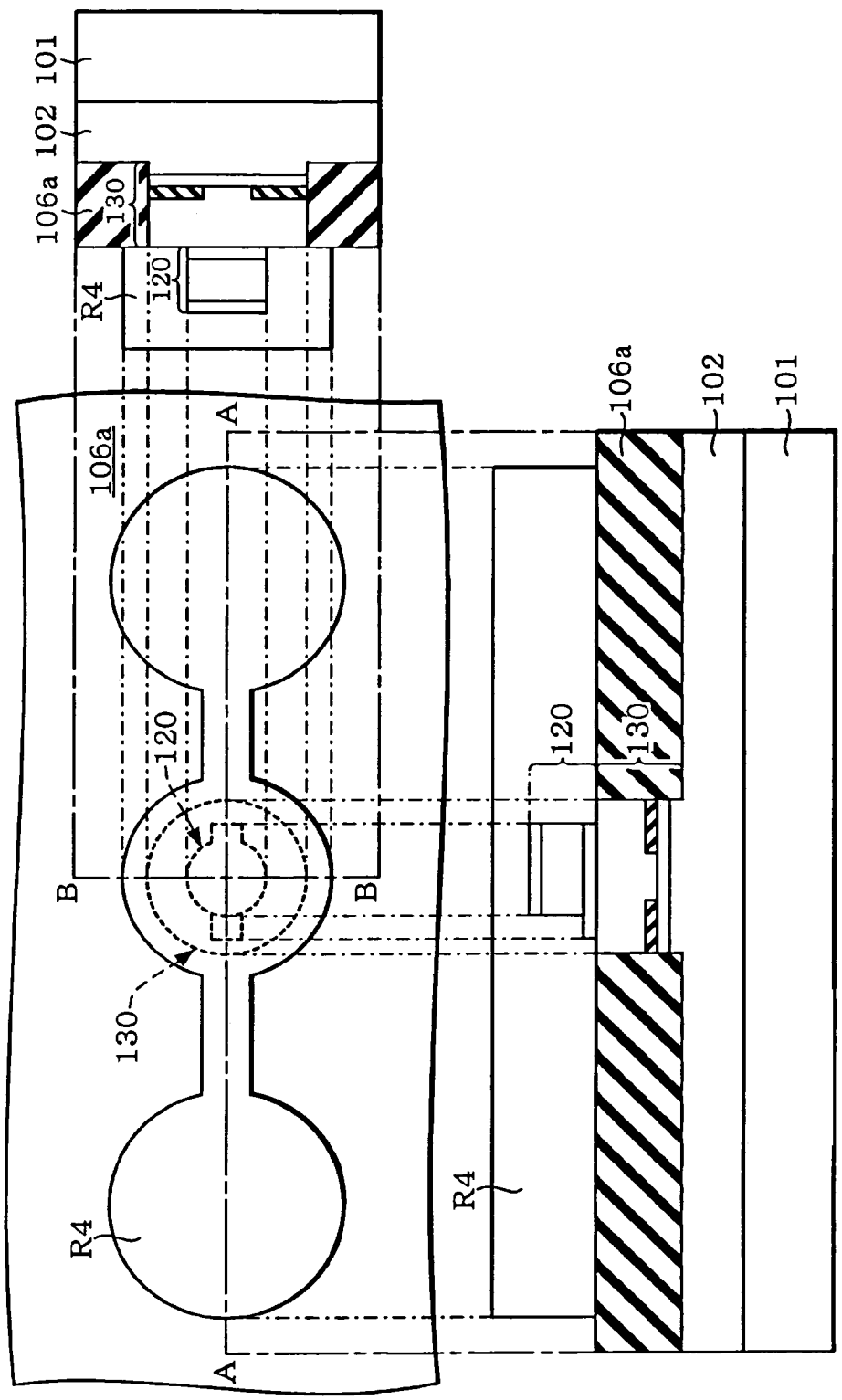
FIG. 10 shows a schematic and cross sectional schematic explaining a manufacturing process of the surface light emitting element shown in FIG. 1.
Figure 11:
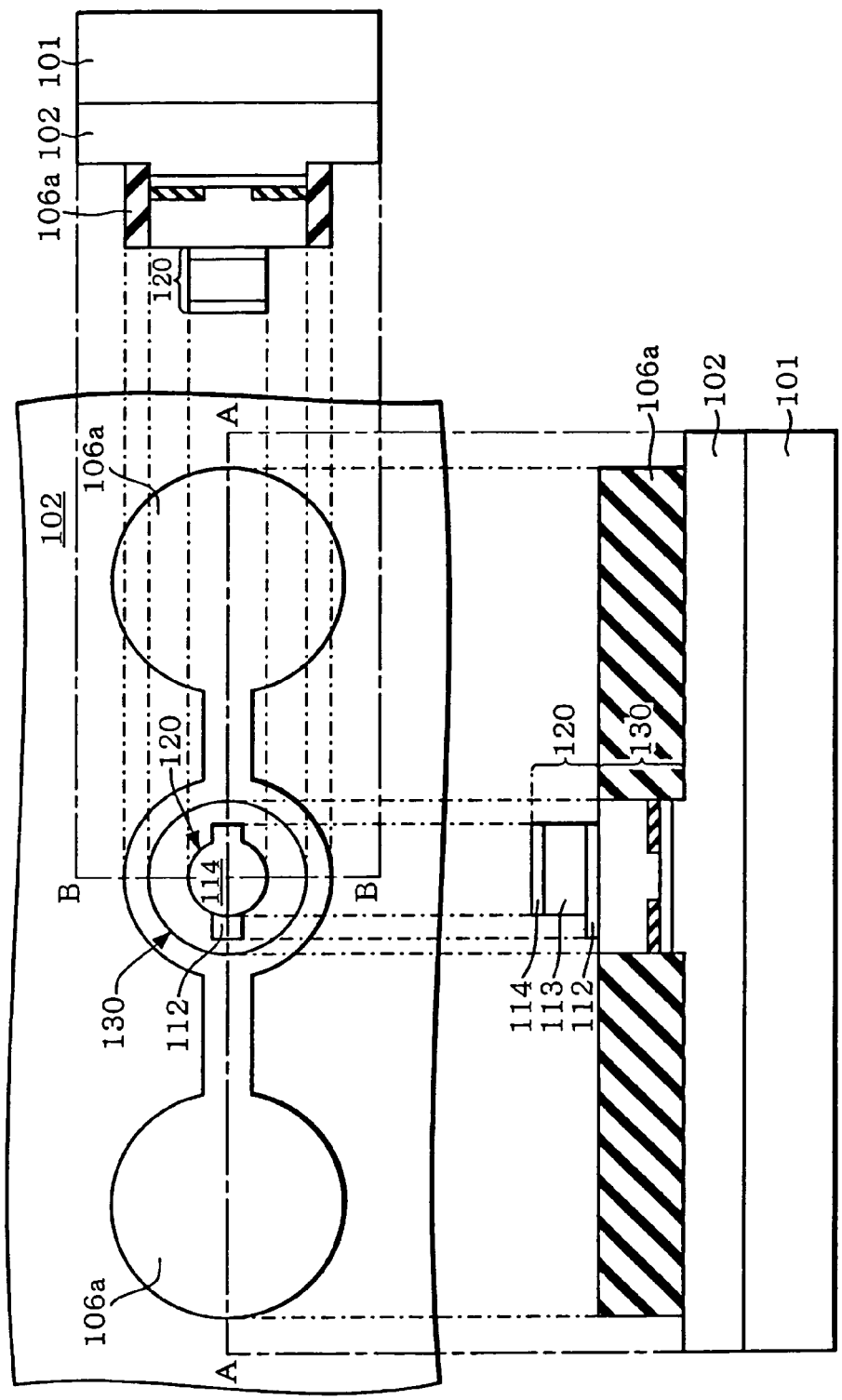
FIG. 11 shows a schematic and cross sectional schematic explaining a manufacturing process of the surface light emitting element shown in FIG. 1.

(6) Next, the first insulating layer 106a covering the side wall of the columnar part 130 is formed (refer to FIG. 10 and FIG. 11)

At first, the first insulating layer 106a is formed so that the side wall of the columnar part 130 is covered with the first insulating layer 106a. A case that using polyimide resin as a material to form the first insulating layer 106a will be described.

For example, by using the spin coat method, resin precursor (polyimide precursor; not shown) is applied on the side wall of the columnar part 130 and then imidized, and the first insulating layer 106a is formed. As for the applying method of the resin precursor, in addition to the above mentioned spin coat method, any suitable technology, such as a dipping method, a spray coat method or an inject method, may be used.

Next, after applying photo resist (not shown) on the first insulating layer 106a, a resist layer R4 having a predetermined pattern is formed by patterning the photo resist by the photo lithography method (refer to FIG. 10).

Then, a part of the first insulating layer 106a is etched, for example, by the dry etching method using the resist layer R4 as a mask. After that, the resist layer R4 is removed. With this process, as shown in FIG. 11, the first insulating layer 106a having a predetermined pattern is formed.

As for a forming method of the first insulating layer 106a, in addition to the above-described method, a method described in the Japanese laid-open patent publication No. 2001-066299 can be used, for example.

Figure 12:
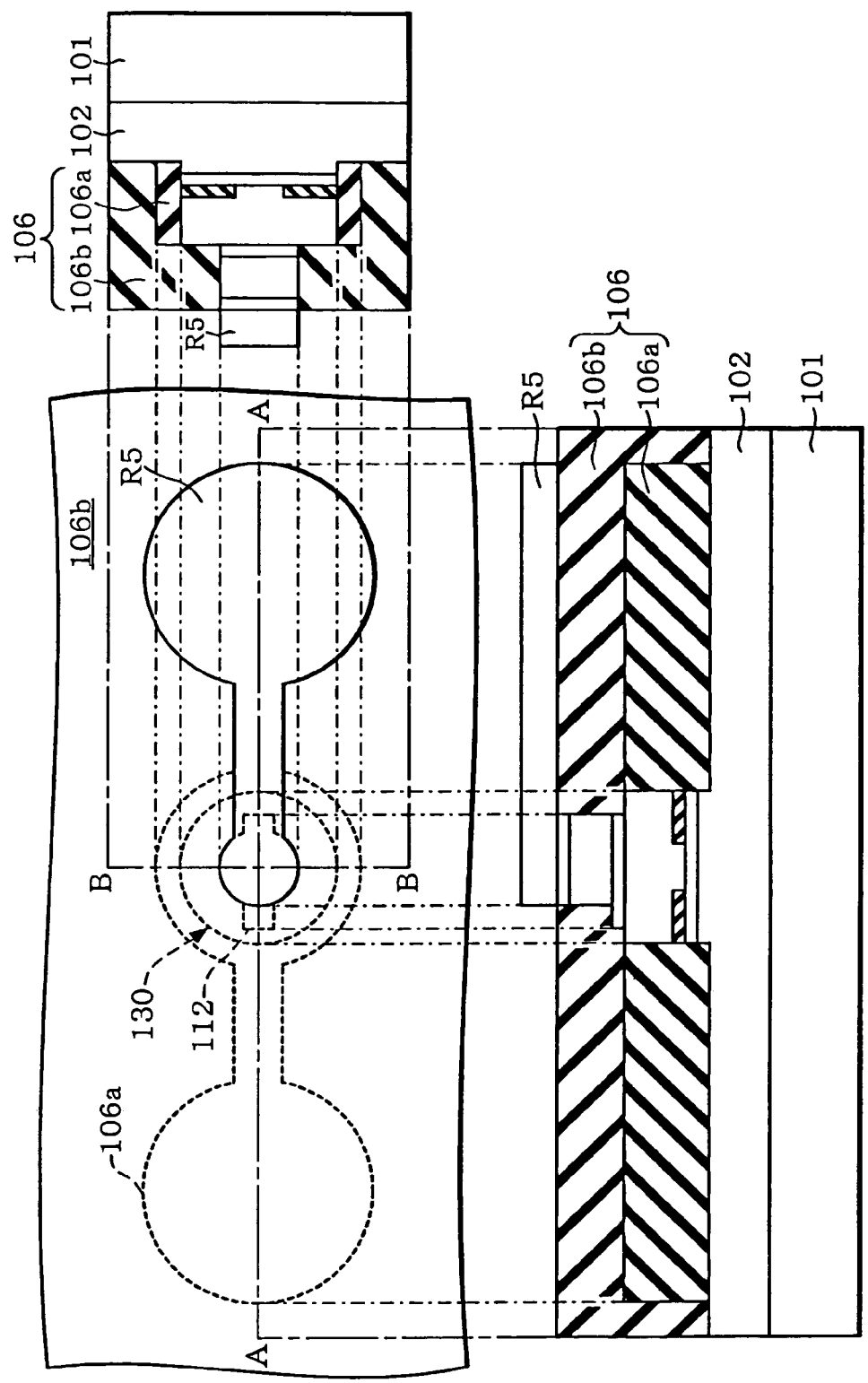
FIG. 12 shows a schematic and cross sectional schematic explaining a manufacturing process of the surface light emitting element shown in FIG. 1.
Figure 13:
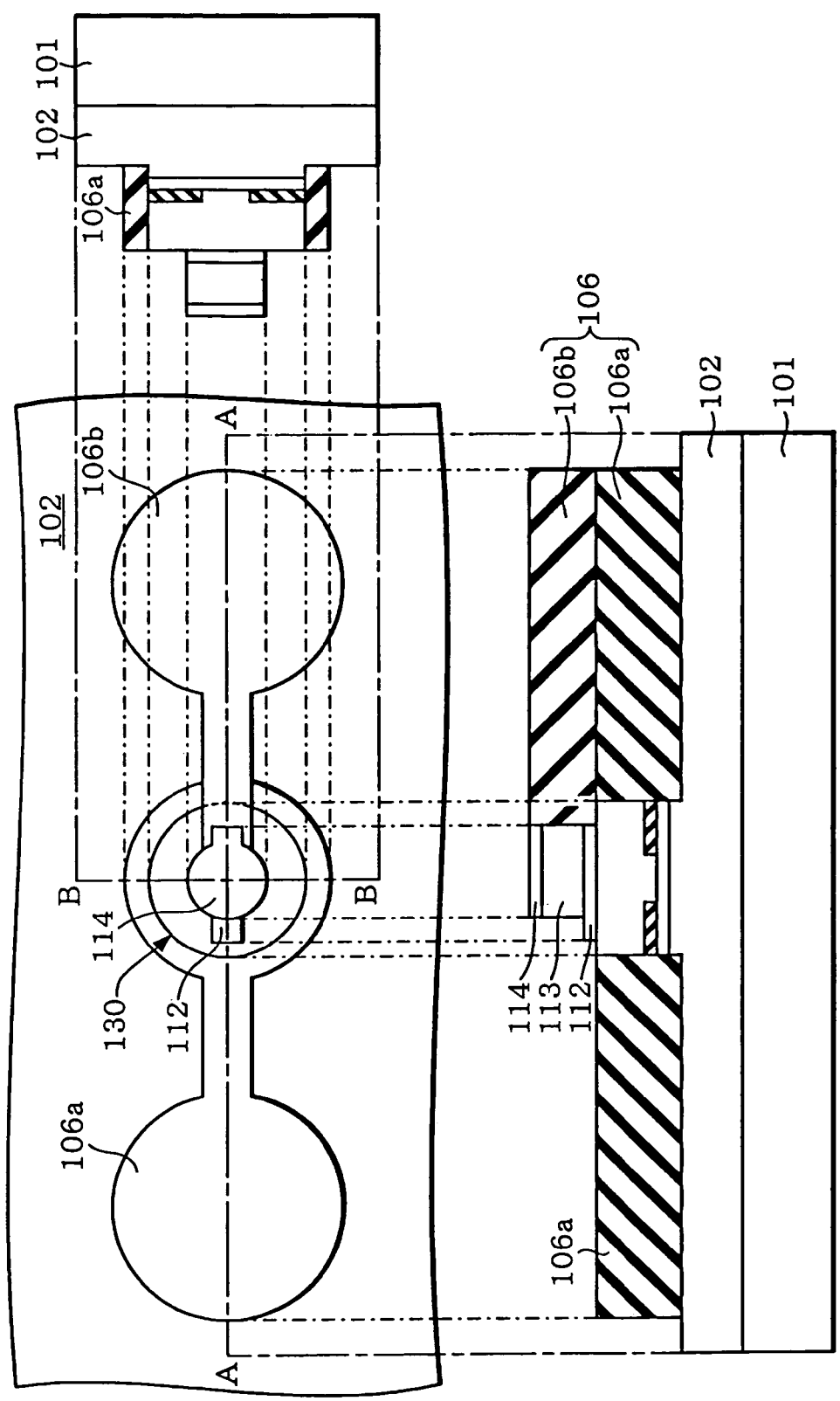
FIG. 13 shows a schematic and cross sectional schematic explaining a manufacturing process of the surface light emitting element shown in FIG. 1.

(7) Next, the second insulating layer 106b is formed on the first insulating layer 106a (refer to FIG. 12 and FIG. 13).

At first, the second insulating layer 106b is deposited on the first insulating layer 106a. The second insulating layer 106b can be made of the above-mentioned materials. For example, when the second insulating layer 106b is formed by using silicon nitride, it can be formed by the plasma CVD method or the like.

Next, after applying photo resist (not shown) on the second insulating layer 106b, a resist layer R5 having a predetermined pattern is formed by patterning the photo resist by the photo lithography method (refer to FIG. 12).

Next, the second insulating layer 106b is removed, for example, by the dry etching method using the resist layer R5 as a mask. After that, the resist layer R5 is removed. With this process, as shown in FIG. 13, the second insulating layer 106b having a predetermined pattern is formed.

Figure 14:
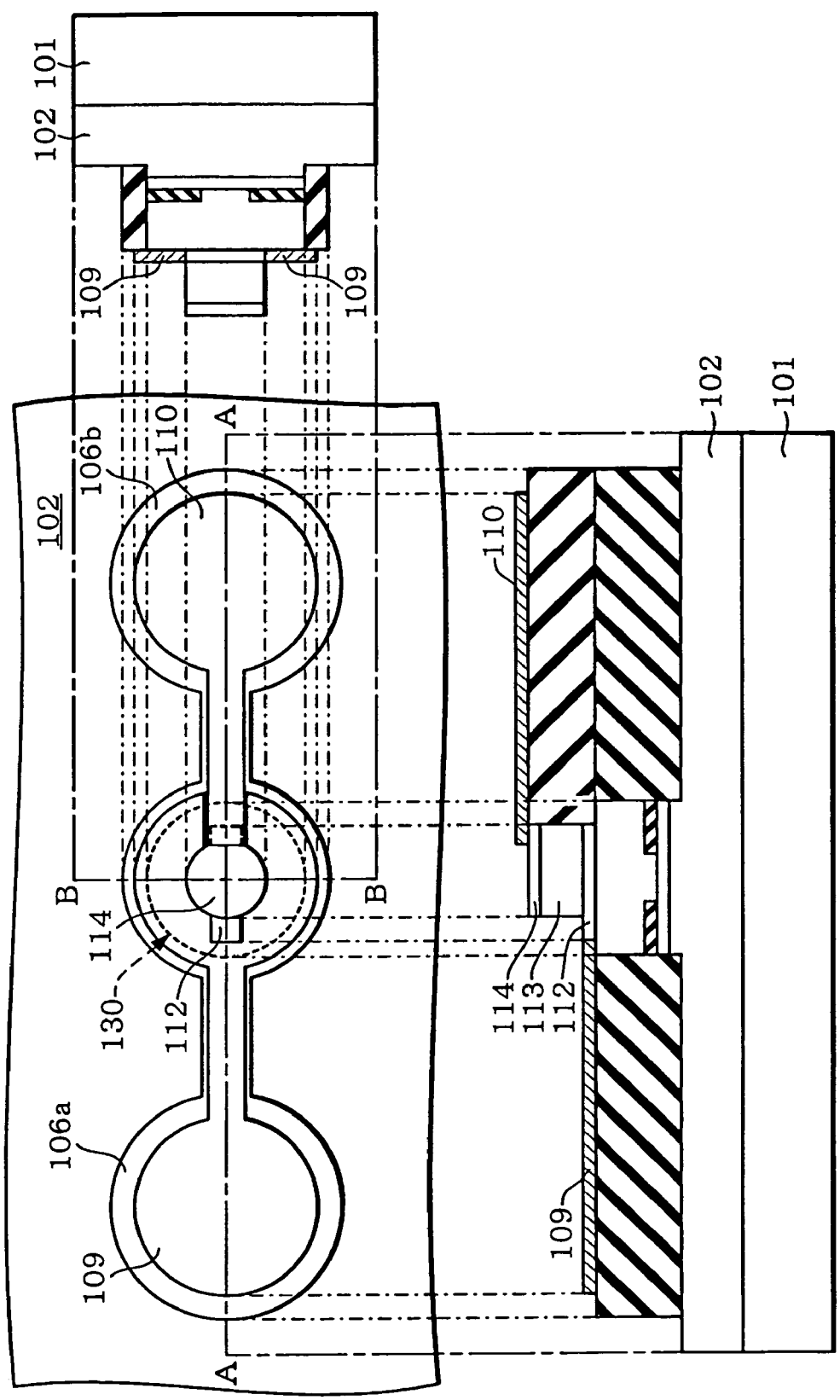
FIG. 14 shows a schematic and cross sectional schematic explaining a manufacturing process of the surface light emitting element shown in FIG. 1.

(8) Next, the first electrode 110, which ohmic-contacts with the first electrode coupling part 114b and extends on the second insulating layer 106b, and the third electrode 109, which ohmic-contacts with the second mirror 104 and extends on the first insulating layer 106a, are formed (refer to FIG. 14).

At first, before forming the first electrode 110 and the third electrode 109, the upper surfaces (114x and 114y) of the first contact layer 114 and the upper surfaces of the first insulating layer 106a and the second insulating layer 106b are cleaned using the plasma processing method, as required. With this process, an element having a more stable characteristic can be formed.

Next, for example, deposited layers (not shown) of Pt, Ti and Au are formed by the vacuum deposition method, for example. Next, the first electrode 110 and the third electrode 109 are formed by removing the deposited layers, which exist on the positions other than the predetermined positions, by the lift-off method. At this time, a part, in which the deposited layer is not formed, is formed on the upper surface 114x of the first light passage part 114a of the first contact layer 114. This part becomes the emitting surface 108. Instead of the lift-off method, the dry etching method can be used in the above process. Furthermore, in the above process, the first electrode 110 and the third electrode 109 are simultaneously patterned. However, the first electrode 110 and the third electrode 109 may be formed separately.

(9) Next, for example, by patterning the deposited layers made of an alloy of Au and Ge, and Au with a similar method, the fourth electrode 107 is formed on the first mirror 102 of the light emitting element part 140. The second electrode 111 is formed on the second electrode coupling part 112b of the light detecting part 120 (refer to FIG. 1). Next, annealing is carried out. The temperature for annealing depends on a material of the electrode. The material for the electrode used in the exemplary embodiment is normally annealed at approximately 400° C. With the above processes, the second electrode 111 and the fourth electrode 107 are formed (refer to FIG. 1).

With the above processes, the surface light emitting element 100 including the light emitting element part 140 and the light detecting part 120 is obtained as shown in FIG. 1.

4. Effect

The surface light emitting element 100 according to the exemplary embodiment has effects 1 through 3, described below. In the description for respective effects 1 through 3, a structure of a related art surface light emitting element, which is a comparison example, will be described in (A), and a structure and effects of the surface light emitting element 100 according to the exemplary embodiment will be described in (B).

(1) Effect 1

(A) Related Art Surface Light Emitting Element.

Figure 24:
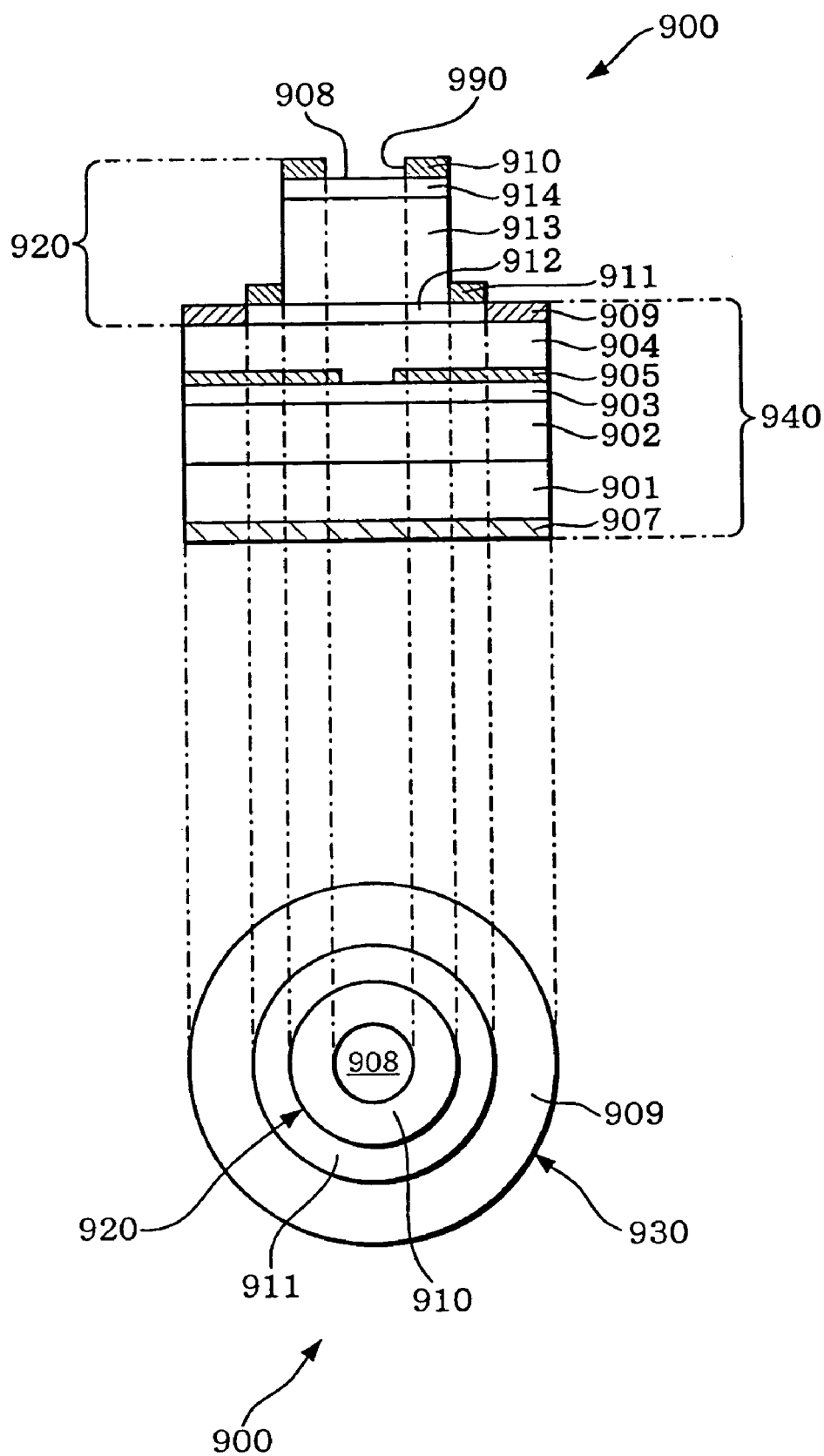
FIG. 24 shows a schematic and a cross sectional schematic explaining a related art surface light emitting element.

FIG. 24 is a schematic and a cross sectional schematic explaining a related art surface light emitting element 900. The surface light emitting element 900 includes a light emitting element part 940 provided on a semiconductor substrate 901, and a light detecting part 920 provided on the light emitting element part 940. The light emitting element part 940 functions as a surface light emitting semiconductor laser. The light (laser beam) is emitted from the light emitting element part 940. The light detecting part 920 absorbs a portion of the light and converts the absorbed light into photoelectric current. An optical output of the light emitting element part 940 can be detected from the photoelectric current value.

The light emitting element part 940 includes an n-type first mirror 902, an active layer 903, in which impurities are not doped, and a p-type second mirror 904. These layers are provided on the n-type semiconductor substrate 901. The second mirror 904 is provided with a current aperture 905. A fourth electrode 907 is provided on a surface, which is an opposite side of mounting surface of the first mirror 902 of the semiconductor substrate 901. Furthermore, a third electrode 909 is provided on the second mirror 904. Furthermore, a second electrode 911 is provided on a second contact layer 912. Each of the third electrode 909 and the second electrode 911 has a plane ring shape. The third electrode 909 and the fourth electrode 907 are provided to flow current into the active layer 903. The first electrode 910 and the second electrode 911 are provided to drive the light detecting part 920.

The light detecting part 920 is provided on the light emitting element part 940 and includes a p-type second contact layer 912, a light absorption layer 913, in which impurities are not doped, and an n-type first contact layer 914. Furthermore, the first electrode 910 is provided on the first contact layer 914. The first electrode 910 has a plane ring shape. In the light detecting part 920, the light absorbed in the light absorption layer 913 is converted into photoelectric current.

As for the surface light emitting element 900, an emitting surface 908 of the light is provided on the upper surface of the light detecting part 920. Specifically, a bottom surface of an opening portion 990 formed by the first electrode 910 having a ring-shape is the emitting surface 908. As for the light emitting element part 940 of the surface light emitting element 900, a case of generating laser beam in multi-mode will be described.

Figure 25:
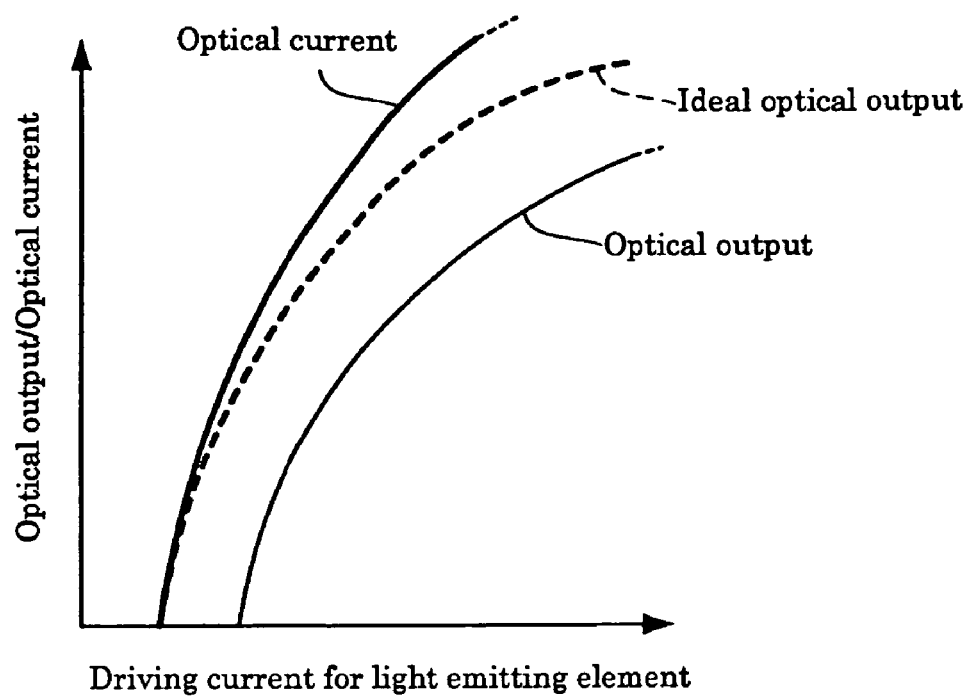
FIG. 25 shows a graph schematically explaining a relation between the driving current, the optical output and the photoelectric current when driving the related art surface light emitting element shown in FIG. 24.

FIG. 25 shows a relation between the driving current of the light emitting element part 940, the output of light (optical output) emitted from the emitting surface 908, and the photoelectric current generated in the light detecting part 920 when the surface light emitting element 900 is driven.

When the surface light emitting element 900 is driven, and a point where the optical output is generated and a point where the photoelectric current is generated are substantially equal, it can be said that the photoelectric current generated in the light detecting part 920 accurately detects the optical output from the light emitting element part 940 (refer to the dotted line in FIG. 25).

However, as for the surface light emitting element 900, as shown in FIG. 25, when a predetermined voltage is applied between the third electrode 909 and the fourth electrode 907, the driving current for the light emitting element part 940 increases. The photoelectric current is generated in the light detecting part 920 before the optical output is generated, that is, before the light is emitted from the emitting surface 908. In this case, it can be said that the optical output from the light emitting element part 940 cannot be accurately detected by the value of the photoelectric current generated in the light detecting part 920.

A reason that the generation timing of the photoelectric current deviates from the generation timing of the optical output will be described below. FIG. 26a shows a cross sectional schematic explaining a part of the light detecting part 920 of the surface light detecting element 900 shown in FIG. 24 by enlarging.

FIG. 26a shows the light absorption layer 913, the first contact layer 914, and the first electrode 910 in the light detecting part 920. Additionally, FIG. 26a shows lines indicating the intensity distribution of laser beam, generated in the active layer 903 in the light emitting element part 940 and entered to the light absorption layer 913. A chain line shows an intensity distribution of the light in single-mold. A solid line shows an intensity distribution of the light in multi-mode. In general, whether the laser beam generated from the surface light emitting semiconductor laser has single-mode or multi-mode depends on a diameter size of the current aperture.

A portion of the laser beam, generated from the light emitting element part 940, is absorbed in the light absorption layer 913. The remaining light passes through the light absorption layer 913, and enters the first contact layer 914. However, as shown in FIG. 26a, the first electrode 910 is provided on the first contact layer 914. For this reason, in a region (region of outside of the dotted line in FIG. 26a) where the first electrode 910 exists on the upper part of the first contact layer 914, the light, which is passed through the light absorption layer 913 and is entered to the first contact layer 914, is reflected by an interface between the first electrode 910 and the first contact layer 914. Accordingly, for this region, the light, which passed through the light absorption layer 913 and entered to the first contact layer 914, is hardly emitted from the emitting surface 908.

The relation between the driving current, the optical output and the photoelectric current shown in FIG. 25 is a case that the laser beam in multi-mode is generated in the light emitting element part 940 of the surface light emitting element 900. Accordingly, as shown in FIG. 26a, the photoelectric current is generated by the light, which is entered to a region of the first contact layer 914 located below the first electrode 910. Therefore, it is considered that the photoelectric current is generated before the optical output is generated.

(B) Surface Light Emitting Element of the Exemplary Embodiment

Figure 26B:
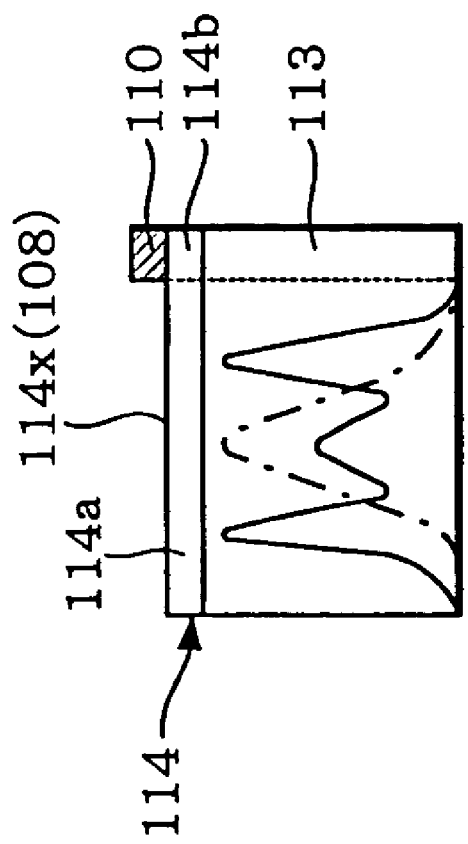
FIG. 26b shows a cross sectional schematic explaining an operation of the surface light emitting element shown in FIG. 1.
Figure 26A:
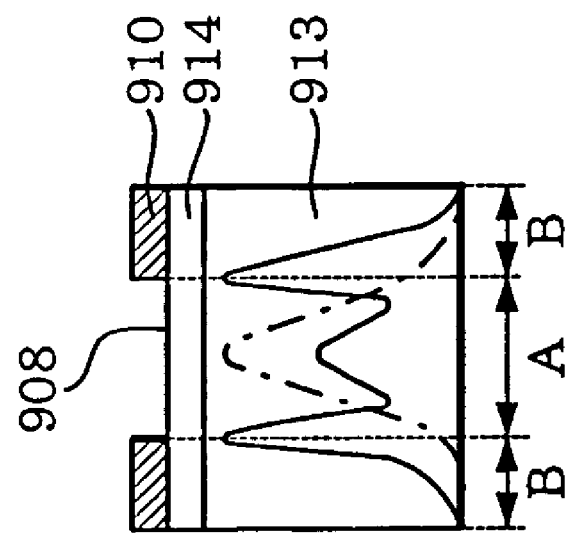
FIG. 26a shows a cross sectional schematic explaining an operation of the related art surface light emitting element shown in FIG. 24.

According to the surface light emitting element 100 of the exemplary embodiment, as shown in FIG. 26b, the first contact layer 114 includes the first light passage part 114a and the first electrode coupling part 114b, extending from the first light passage part 114a, and the first electrode 110 is provided only on the first electrode coupling part 114b of the first contact layer 114.

FIG. 26b shows a cross sectional schematic explaining a part of the light detecting part 120 of the surface light emitting element 100 shown in FIG. 1 by enlarging. As shown in FIG. 26b, the first electrode 110 is not provided on the first light passage part 114a. That is, the first electrode 110 is excluded from the upper surface 114x of the first light passage part 114a. According to this configuration, most of the light, which passed through the light absorption layer 113 and entered to the first light passage part 114a, can be emitted from the upper surface 114x (emitting surface 108) of the first light passage part 114a. A correlation exists between the photoelectric current flowing to the light detecting part 120 and the output of the light, emitted from the emitting surface 108. Accordingly, the output of the light emitted from the emitting surface 108 can be accurately detected.

(2) Effect 2

(A) The surface light emitting laser has a characteristic that the intensity distribution of the generated laser beam varies with magnitude of the diving current (IEEE, Journal of Quantum Electronics, Vol. 38, No. 2, February 2002). When the laser beam generated by the surface light emitting semiconductor laser is in single-mode (refer to a waveform shown by a chain line in FIG. 26a), the change of the intensity distribution of the generated laser beam is small. Therefore, the change of the intensity distribution of the generated laser beam is relatively small against the change of the driving current. For this reason, when the laser beam generated in the surface light emitting element 900 shown in FIG. 24 is in single-mode, a ratio of the light, emitted from the emitting surface 908, to the total light amount of light, which entered the first contact layer 914, does not significantly change with the change of the driving current.

When the laser beam generated from the surface light emitting semiconductor laser is in multi-mode (refer to a waveform shown by a solid line in FIG. 26a), the change of the intensity distribution of the generated laser beam is large. Therefore, the intensity distribution of the generated laser beam changes significantly with the change of the driving current.

Accordingly, for the surface light emitting element 900, when the generated laser beam is in multi-mode, a ratio of light, emitted from the emitting surface 908, to the total amount of light, which is entered to the first contact layer 914, changes significantly with the change of the driving current. For this reason, a ratio of light, which is reflected by the first electrode 910 and cannot be emitted from the emitting surface 908, to the total amount of light, which is entered to the first contact layer 914, also changes significantly.

When the generated laser beam is in multi-mode, the intensity distribution of the generated laser beam changes significantly with the change of the driving current. Therefore, in FIG. 26a, a ratio between the light existing in region A and the light existing in region B changes significantly. As a result, a correlation between the photoelectric current generated in the light detecting part 920 and the output of the light emitted from the emitting surface 908 becomes small. Because of this, it is difficult to accurately monitor the output of the light emitted from the light emitting element part 940 by the light detecting part 920.

(B) According to the surface light emitting element 100 of the exemplary embodiment, the first electrode 110 is provided only on the first electrode coupling part 114b of the first contact layer 114. Therefore, most of the light, which is passed through the light absorption layer 113 and enters the first light passage part 114a, can be emitted from the emitting surface 108. For this reason, even if the light generated in the light emitting element part 140 is in multi-mode, a ratio of light emitted from the emitting surface 108 can be prevented from changing with the change of the intensity distribution of the light. As a result, a correlation between the photoelectric current and the optical output can be maintained.

As for the surface light emitting element 100 of the exemplary embodiment, the above-described effects can be obtained for both cases of generating the light in single-mode and generating the light in multi-mode. In particular, the above-described problem can be addressed when generating the light in multi-mode.

In general, the surface light emitting semiconductor laser, which generates the light in multi-mode, is coupled to a multi-mode optical fiber in many cases. Compared with coupling the emitted light in single-mode and the single-mode optical fiber, a positioning to couple the emitted light in multi-mode and the multi-mode optical fiber is easier. Therefore, this is suitable for optical communication in relatively short distance, which requires miniaturization and low cost.

(3) Effect 3

(A) As for the surface light emitting element 900 shown in FIG. 24, the third electrode 909 is provided on the light emitting element part 940, and has a ring shape. The light detecting part 920 is provided inside of the third electrode 909. Accordingly, the diameter of the light emitting element part 940 is larger than that of the light detecting part 920.

When the current aperture 905 is formed in the light emitting element part 940 by oxidation, it generally becomes difficult to control the diameter of the current aperture if the diameter of the light emitting element part 940 becomes a larger current aperture.

(B) As for the surface light emitting element 100 of the exemplary embodiment, the third electrode 109 is provided so as to partially surround the second contact layer 112. The first electrode 107 and the second electrode 109 are excluded from the region $X_1$, partially surrounded by the third electrode 109, and inside of the region $X_2$, vertically above the region $X_1$ (refer to FIG. 4). Because of this, it is unnecessary to form the light detecting part 120 inside of the third electrode 109. For this reason, a difference between the diameter size of the light detecting part 120 and the diameter size of the light emitting element part 140 can be made smaller. Accordingly, the diameter of the light emitting element part 140 can be made smaller, and in this case, the diameter of the current aperture 105 can be controlled more easily.

Second Exemplary Embodiment

1. Structure of Surface Light Emitting Element

Figure 15:
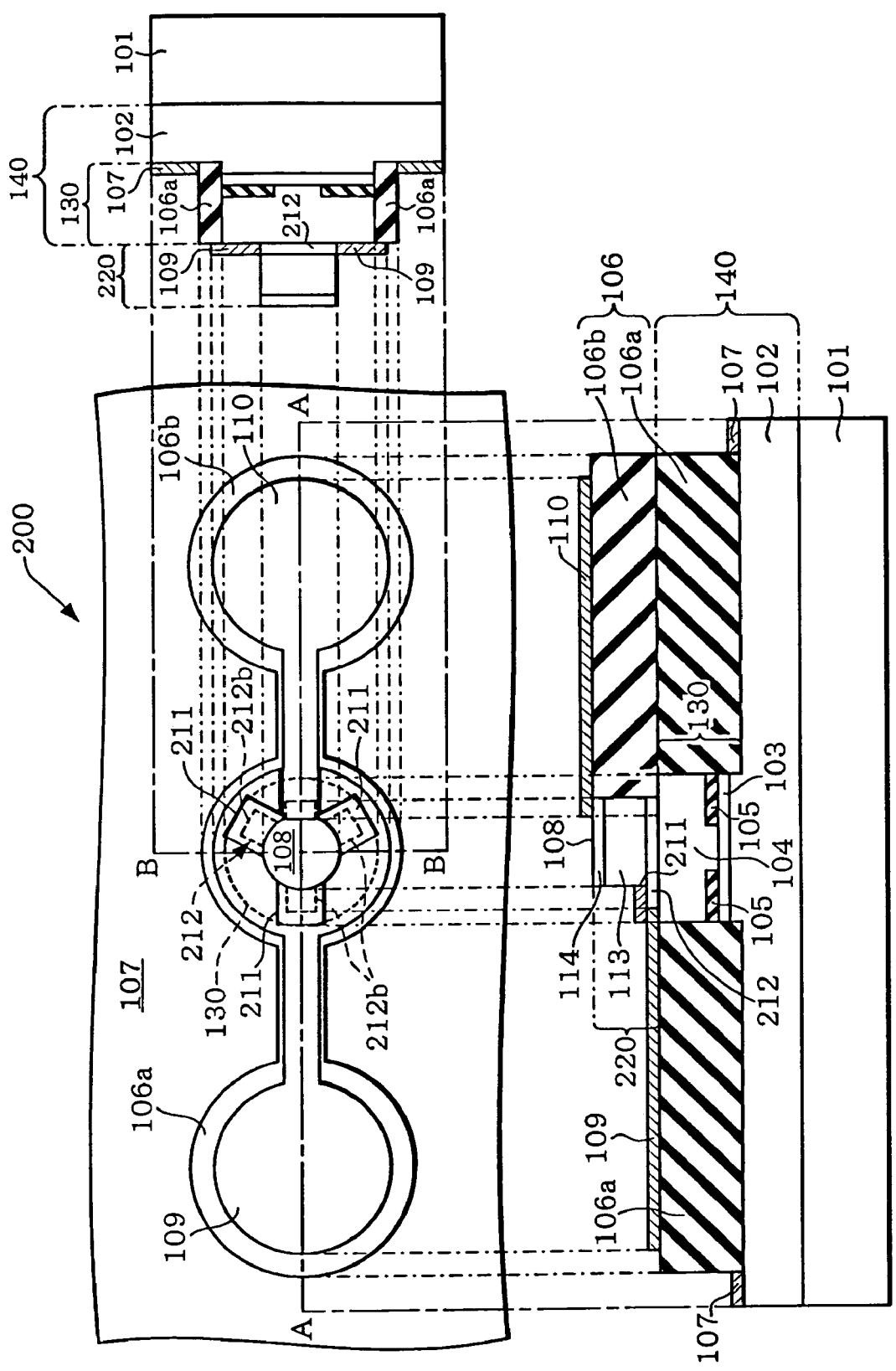
FIG. 15 shows a schematic and cross sectional schematic explaining a surface light emitting element of a second embodiment according to the present invention.
Figure 16:
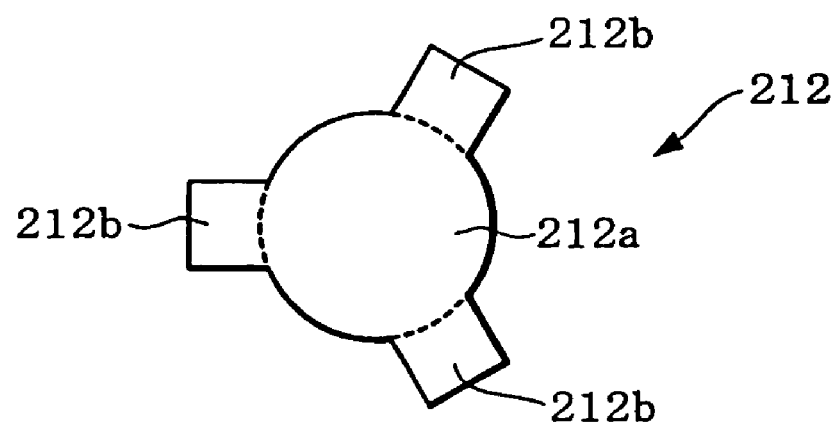
FIG. 16 shows a schematic explaining a second contact layer shown in FIG. 15 by enlarging.
Figure 17:
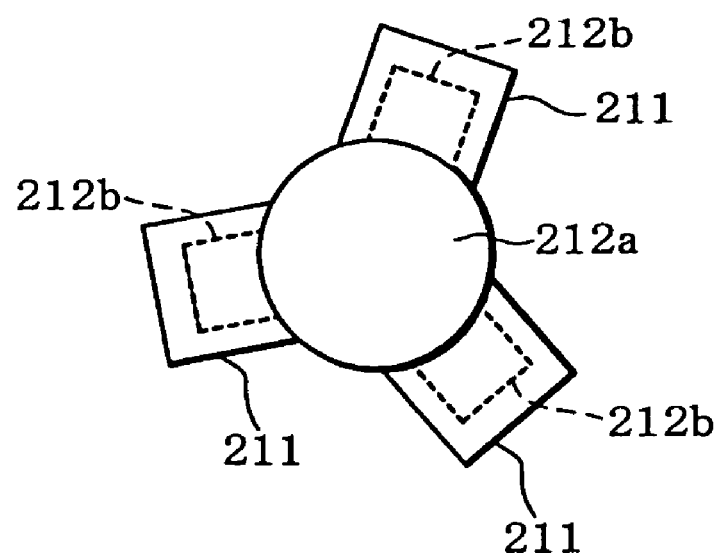
FIG. 17 shows a schematic explaining a second contact layer and a second electrode shown in FIG. 15 by enlarging.

FIG. 15 shows a schematic and cross sectional schematics explaining a surface light emitting element 200 according to a second exemplary embodiment applying the present invention. FIG. 16 shows a schematic and a cross sectional schematic explaining a second contact layer 212 shown in FIG. 15 by enlarging. FIG. 17 shows a schematic and a cross sectional schematic explaining a second contact layer 212 and a second electrode 211 shown in FIG. 15 by enlarging. As for the exemplary embodiment, a case that the surface light emitting semiconductor laser is used as the surface light emitting element will be described, which is similar to the first exemplary embodiment.

The surface light emitting element 200 according to the exemplary embodiment generally has the same structure as the surface light emitting element 100 according to the first exemplary embodiment except that a plurality of the second coupling parts 212b and second electrodes 211 are provided to the second contact layer 212. For this reason, the structural elements, which are substantially the same as those in the surface light emitting element 100 according to the first exemplary embodiment, are attached with the same symbols, and their detailed descriptions will be omitted.

As shown in FIGS. 15 through 17, as for a light detecting part 220 of the surface light emitting element 200 according to the exemplary embodiment, a plurality of the second coupling parts 212b of the second contact layer 212 are provided. Furthermore, the second electrodes 211 are provided on the second electrode coupling parts 212b. Furthermore, a part of the second electrode 211 are provided on the third electrode 109.

The second electrode coupling parts 212b and the second electrodes 211 can be respectively made of the same materials as those of the first electrode coupling part 112b and the second electrode 111 of the first exemplary embodiment. As shown in FIG. 15, each of the second electrode coupling parts 212 are provided on a position where each of the second electrode coupling part 212bs does not overlap two-dimensionally with the first electrode coupling part 114b of the first contact layer 114.

2. Operation of Surface Light Emitting Element

Operation of the surface light emitting element 200 according to the exemplary embodiment is basically the same as that of the surface light emitting element 100 according to the first exemplary embodiment. Therefore, the detailed description will be omitted.

3. Manufacturing Method of Surface Light Emitting Element

Figure 18:
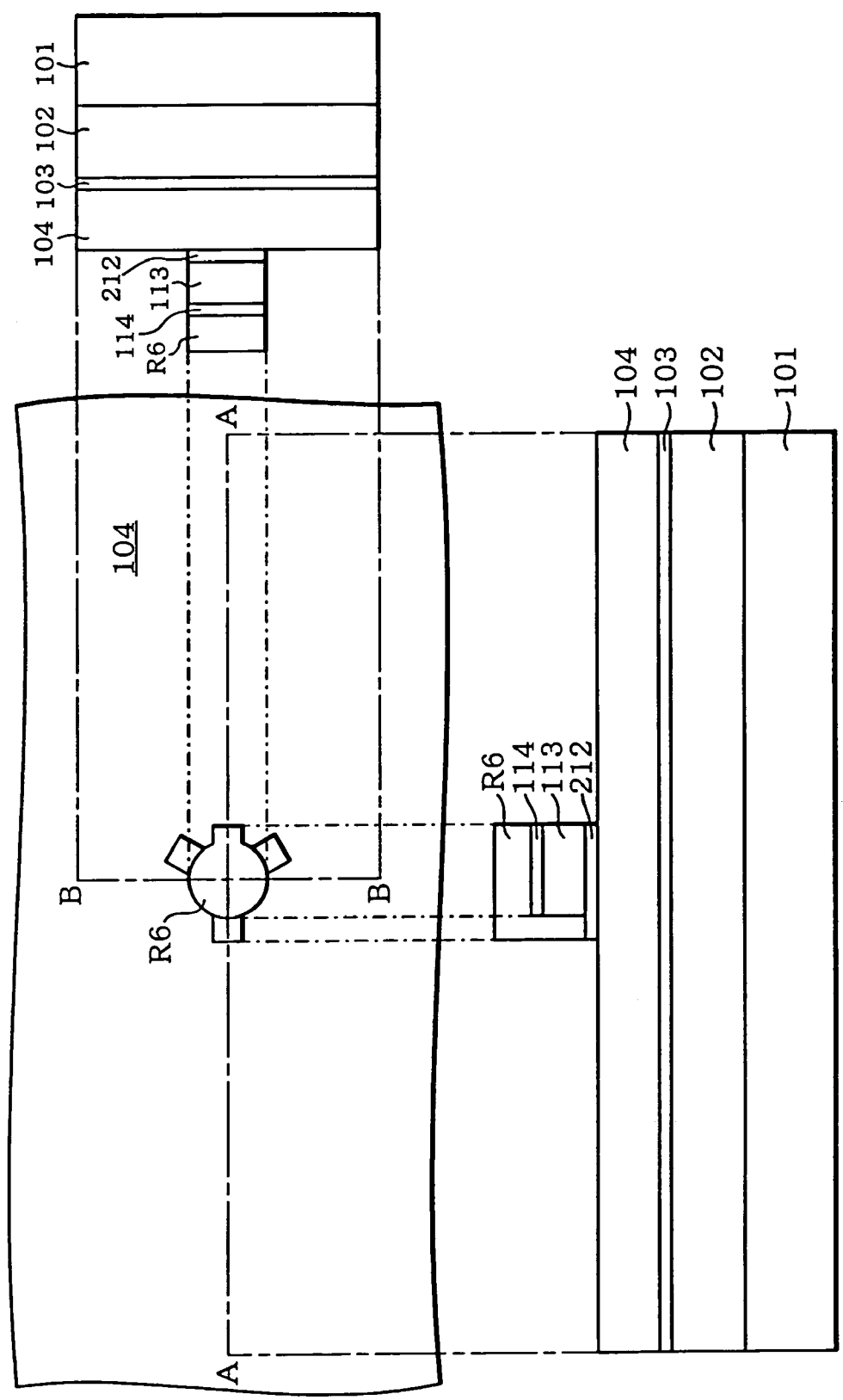
FIG. 18 shows a schematic and a cross sectional schematic explaining a manufacturing process of the surface light emitting element shown in FIG. 15.

As for a manufacturing method of the surface light emitting element 200 according to the exemplary embodiment, after providing the plurality of second electrode coupling parts 212b by patterning using the resist layer R6 having a predetermined plane shape as a mask in a process of patterning the second contact layer 212 (refer to FIG. 18), each of the second electrodes 211 are provided on each of the second electrode coupling parts 212b. Except for the above process, the manufacturing process is same as that of the manufacturing process (refer to FIGS. 5 through 14) of the surface light emitting element 100 according to the above-described first exemplary embodiment. Therefore, the detailed description will be omitted.

4. Effects

The surface light emitting element 200 according to the exemplary embodiment has substantially the same effects as the surface light emitting element 100 according to the first exemplary embodiment. Furthermore, as for the surface light emitting element 200 according to the exemplary embodiment, the plurality of the second electrode coupling parts 212b and the second electrodes 211 of the second contact layer 212 are provided. Therefore, an uniform electric field can be effectively formed by the second contact layer 212. This allows the light detecting part 120 to drive at a higher speed. In addition, the second contact layer 212 and the second electrode 211 of the surface light emitting element 200 according to the exemplary embodiment may be applied to a surface light emitting element of a third exemplary embodiment described later.

Third Exemplary Embodiment

1. Structure of Surface Light Emitting Element

Figure 19:
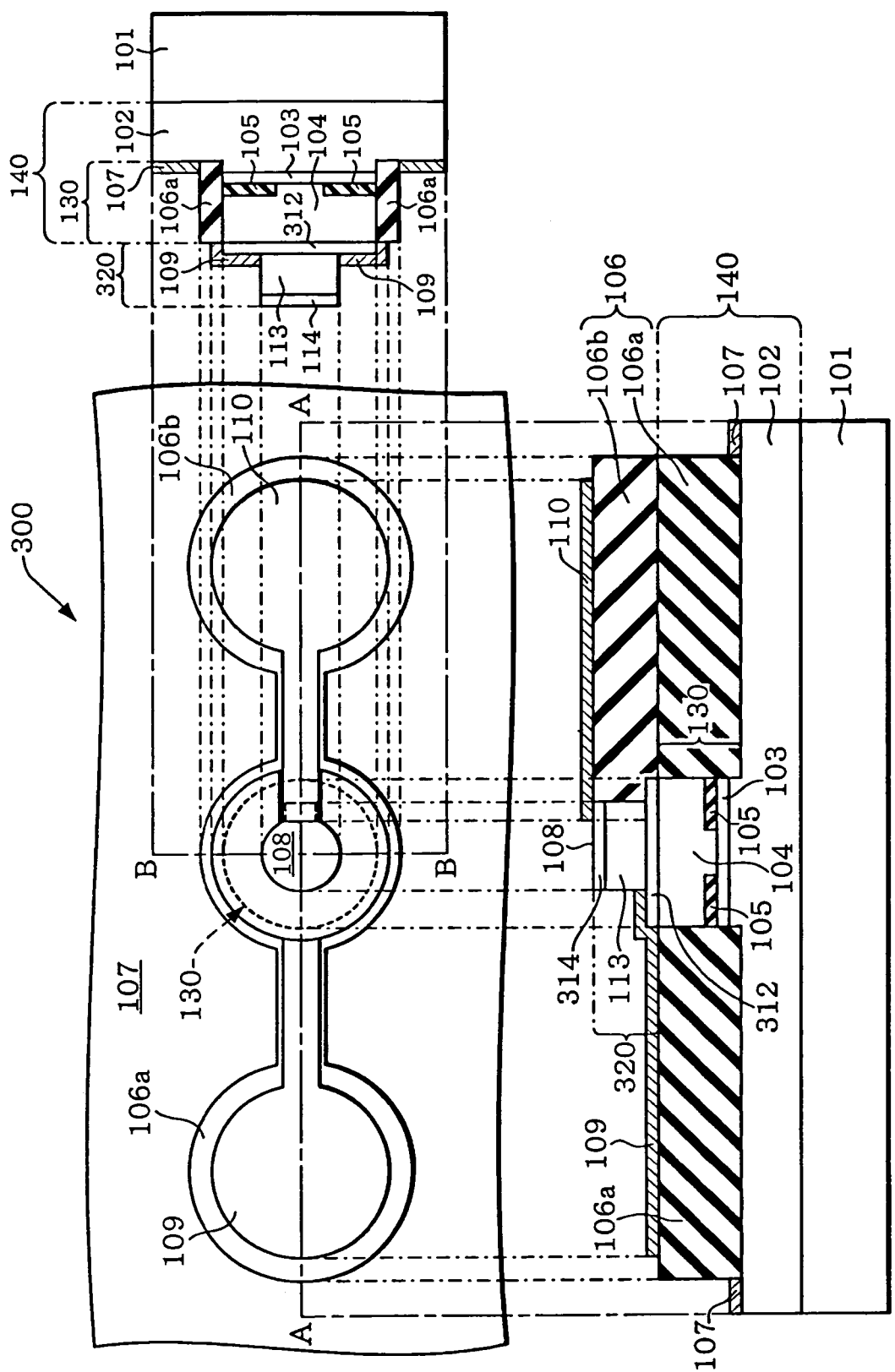
FIG. 19 shows a schematic and a cross sectional schematic explaining a surface light emitting element of a third exemplary embodiment according to the present invention.

FIG. 19 shows a schematic and cross sectional schematics explaining a surface light emitting element 300 according to a third exemplary embodiment. As for the exemplary embodiment, a case that the surface light emitting semiconductor laser is used as the surface light emitting element will be described, which is similar to the first exemplary embodiment and the second exemplary embodiment.

The surface light emitting element 300 according to the exemplary embodiment has a different structure from the surface light emitting element 100 according to the first exemplary embodiment in that a light detecting part 320 includes a second contact layer 312, formed of p-type GaAs, and a first contact layer 314, formed of n-type GaAs. The second electrode coupling part is not provided to the second contact layer 312, and the third electrode 109 also functions as a second electrode. Except for the above points, it has generally the same structure as the surface light emitting element 100 according to the first exemplary embodiment. For this reason, the structural elements, which are substantially the same as those in the surface light emitting element 100 according to the first exemplary embodiment, are attached with the same symbols, and their detailed descriptions will be omitted.

As for the light detecting part 320 of the surface light emitting element 300 according to the exemplary embodiment, the second contact layer 312 formed of p-type GaAs, the light absorption layer 113, in which impurities are not doped, and the first contact layer 314, formed of n-type GaAs, are deposited in order. As for the light detecting part 320, the second contact layer 312, the light absorption layer 113, and the first contact layer 314 have the same plane shapes. Furthermore, the third electrode 109 in the light emitting element part 140 also functions as the second electrode, which drives the light detecting part 320. Specifically, the light emitting element part 140 and the light detecting part 320 share the third electrode 109.

Furthermore, in the light emitting element part 140, the n-type first mirror 102, the active layer 103, and the p-type second mirror 104 are deposited in order. Furthermore, the p-type second contact layer 312 of the light detecting part 320 is provided on the p-type second mirror 104. Accordingly, the light emitting element part 140 and the light detecting part 320 as a whole form an npn structure by the n-type first mirror 102, the p-type second mirror 104, the p-type second contact layer 312, and the n-type first contact layer 314. In this case, a surface light emitting element having a pnp structure as a whole can be formed by exchanging the n-type and the p-type in each layer.

2. Operation of Surface Light Emitting Element

As for the surface light emitting element 300 according to the exemplary embodiment, in the light detecting part 320, the deposited structure of the diode is in reverse of that of the surface light emitting element 100 according to the first exemplary embodiment. For this reason, compared with the operation of the surface light emitting element 100 according to the first exemplary embodiment, as for the operation of the surface light emitting element 300 according to the exemplary embodiment, the moving direction of electric charges, generated by the absorption of the light in the light absorption layer 113, is opposite of the direction that the photoelectric current flows. The operation, except for the above point, is basically the same as that of the surface light emitting element 100 according to the first exemplary embodiment, therefore, the detailed description will be omitted.

3. Manufacturing Method of Surface Light Emitting Element

Figure 20:
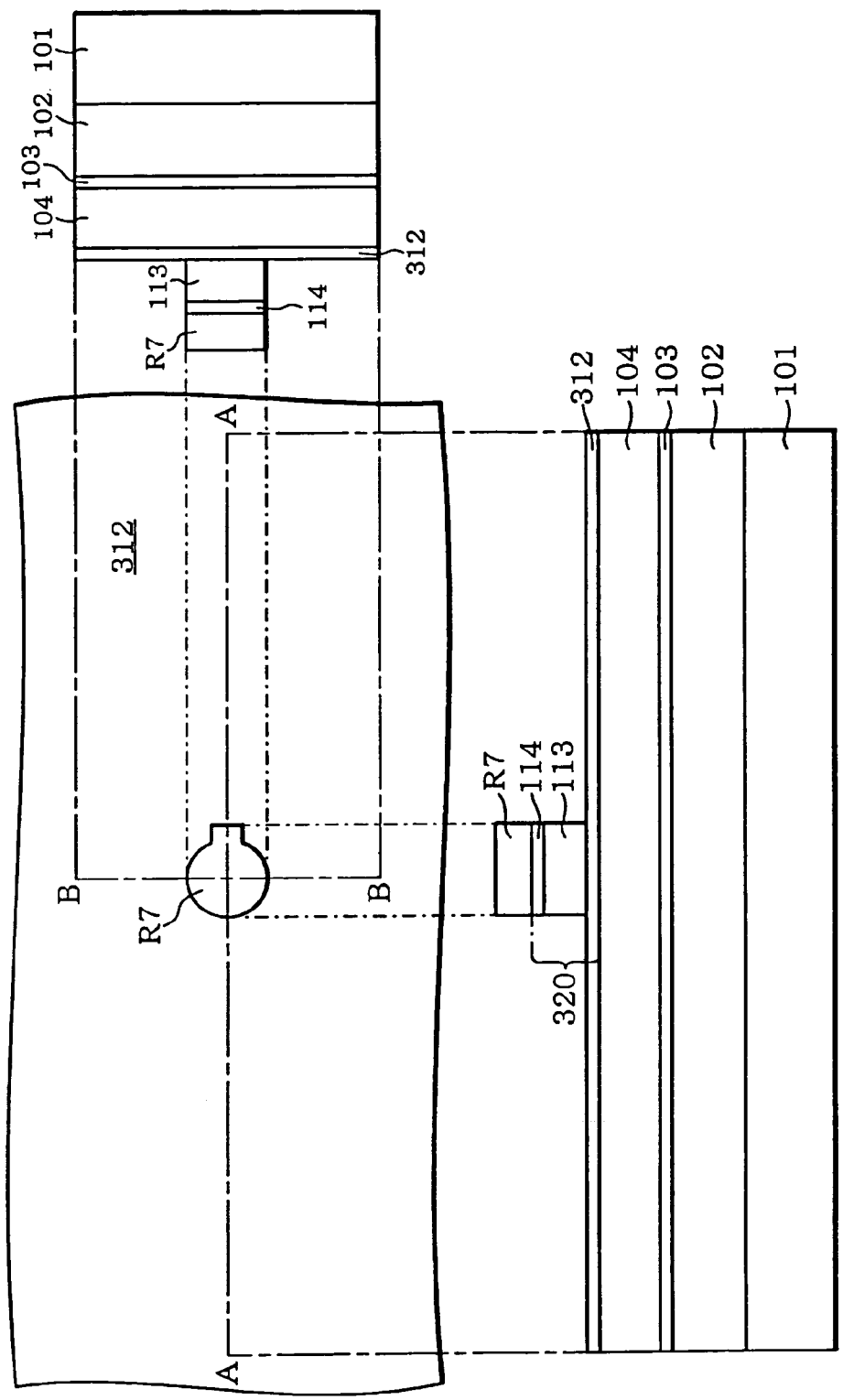
FIG. 20 shows a schematic and a cross sectional schematic explaining a manufacturing process of the surface light emitting element shown in FIG. 19.

As for a manufacturing process of the surface light emitting element 300 according to the exemplary embodiment, as shown in FIG. 20, a process of separately patterning the second contact layer 312 after patterning the first contact layer 114 and the light absorption layer 113 can be omitted. Furthermore, the third electrode 109 also functions as the second electrode. Therefore, it is unnecessary to from the second electrode when forming electrodes. Except for the above points, the manufacturing process of the exemplary embodiment is the same as the manufacturing process (refer to FIGS. 5 through 14) of the surface light emitting element 100 according to the first exemplary embodiment described above. For this reason, the detailed description will be omitted.

4. Effect

The surface light emitting element 300 and the manufacturing method according to the exemplary embodiment have substantially the same effects as the surface light emitting element 100 and the manufacturing method according to the first exemplary embodiment.

Additionally, according to the surface light emitting element 300 of the exemplary embodiment, the process of separately patterning the second contact layer 312 is unnecessary. Therefore, the surface light emitting element 300 can be manufactured in a shorter process. In addition to this, according to the surface light emitting element 300 of the exemplary embodiment, the light emitting element part 140 and the light detecting part 320 share the third electrode 109. Therefore, it is unnecessary to separately form the second electrode, which drives the light detecting part 320. This allows the manufacturing process to be shortened.

Fourth Exemplary Embodiment

Figure 21:
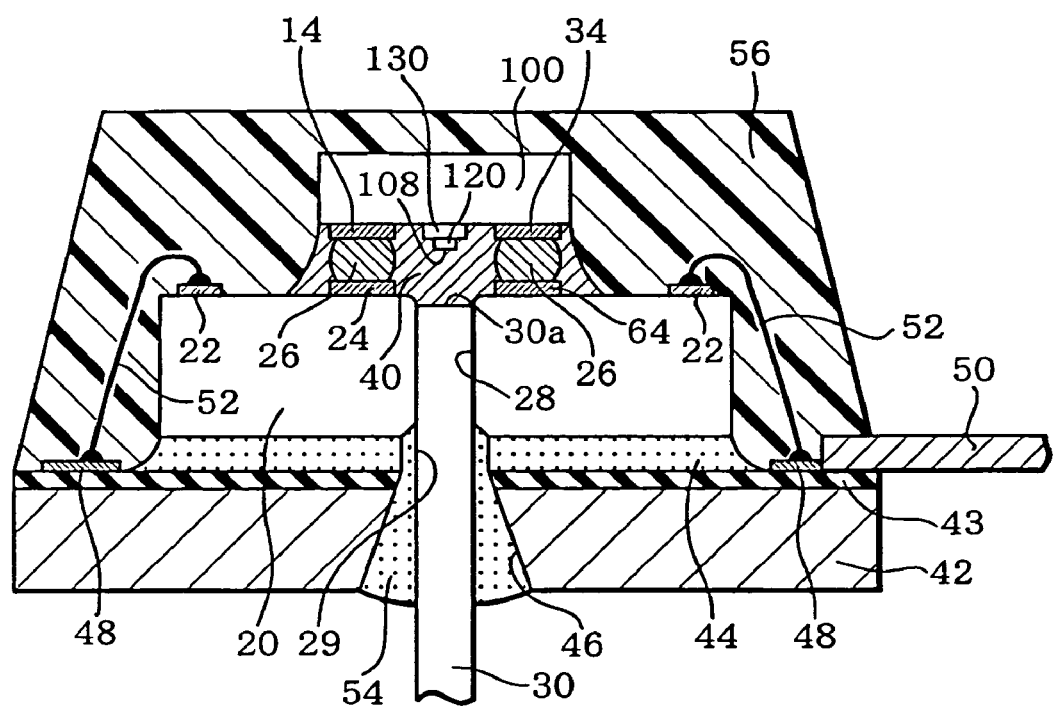
FIG. 21 shows a cross sectional schematic explaining an optical module of a fourth exemplary embodiment according to the present invention.

FIG. 21 shows a schematic explaining an optical module according to a fourth exemplary embodiment applying the present invention. The optical module includes the surface light emitting element 100 of the first exemplary embodiment (refer to FIG. 1), a semiconductor chip 20, and an optical fiber 30. As for the optical module of the exemplary embodiment, the same effects can be obtained even when the surface light emitting element 200 according to the second exemplary embodiment or the surface light emitting element 300 according to the third exemplary embodiment is used instead of the surface light emitting element 100 according to the first exemplary embodiment. This is the same for a fifth exemplary embodiment and a sixth exemplary embodiment described later.

1. Structure of Optical Module

The surface light emitting element 100 absorbs the light emitted from an end face 30a of the optical fiber 30. As for the surface light emitting element 100, a relative position with the end face 30a of the optical fiber 30 is fixed. Specifically, the emitting surface 108 of the surface light emitting element 100 faces the end face 30a of the optical fiber 30.

The semiconductor chip 20 is mounted to drive the surface light emitting element 100. That is, the semiconductor chip 20 incorporates a circuit to drive the surface light emitting element 100. A plurality of electrodes (or pads) 22, electrically coupled to the internal circuit, are formed on the semiconductor chip 20. Wiring patterns 24 and 64, electrically coupled to at least one of the electrodes 22, may be formed on a surface where the electrodes 22 are formed.

The semiconductor chip 20 and the surface light emitting element 100 are electrically coupled. For example, a wiring pattern 14 and the wiring pattern 24 formed on the semiconductor chip 20 are electrically coupled via solder 26. The wiring pattern 14 is electrically coupled to the third electrode 109 (not shown in FIG. 21) of the surface light emitting element 100. Furthermore, a wiring pattern 34 and the wiring pattern 64 formed on the semiconductor chips 20 are electrically coupled via the solder 26. The wiring pattern 34 is electrically coupled to the fourth electrode 107 (not shown in FIG. 21) of the surface light emitting element 100.

The surface light emitting element 100 can be face-down mounted to the semiconductor chip 20. This allows not only electrical coupling by the solder 26, but also fixing the surface light emitting element 100 and the semiconductor chip 20. A wire or conductive paste may be used to couple the wiring pattern 14 and the wiring pattern 24, and the wiring patter 34 and the wiring pattern 64.

Underfill material 40 may be provided between the surface light emitting element 100 and the semiconductor chip 20. When the underfill material 40 covers the emitting surface 108 of the surface light emitting element 100, the underfill material 40 may be transparent. The underfill material 40 covers and protects electrical coupling between the surface light emitting element 100 and the semiconductor chip 20, and further protects the surfaces of the surface light emitting element 100 and the semiconductor chip 20. Furthermore, the underfill material 40 maintains a coupling state of the surface light emitting element 100 and semiconductor chip 20.

A hole portion 28 (for example, a through-hole portion) may be formed in the semiconductor chip 20. The optical fiber 30 is inserted into the hole portion 28. The hole portion 28 is formed from the surface where the electrode 22 is formed, and extending to the surface of the opposite side while avoiding the internal circuit. A taper 29 may be formed in at least one opening end of the hole portion 28. By forming the taper 29, the optical fiber 30 can be easily inserted into the hole portion 28.

The semiconductor chip 20 may be mounted on a substrate 42. Specifically, the semiconductor chip 20 may be mounted on the substrate 42 via an adhesive agent 44. A hole portion 46 is formed in the substrate 42. The hole portion 46 is formed on a position where it is communicated with the hole portion 28 in the semiconductor chip 20. The adhesive agent 44, adhering the semiconductor chip 20 and the substrate 42, is provided not to inhibit communication of the two hole portions 28 and 46, and not to block these hole portions. The hole portion 46 in the substrate 42 is tapered so that the inner diameter is larger in the direction opposite to the semiconductor chip 20. This allows the insertion of the optical fiber 30 easier.

The substrate 42 may be formed of insulating materials, such as resin, glass and ceramics, or may be formed of conductive materials, such as metal. When the substrate 42 is made of conductive materials, an insulating film 43 may be formed at least on a surface where the semiconductor chip 20 is mounted. Similar materials may be used for the substrate 42 in the following exemplary embodiments.

Furthermore, the substrate 42 may have high heat conductivity. This facilitates the heat dissipation of at least one of the surface light emitting element 100 or the semiconductor chip 20. In this case, the substrate 42 is a heat sink or a heat spreader. As for the exemplary embodiment, the semiconductor chip 20 is adhered to the substrate 42. Therefore, the semiconductor chip 20 can be directly cooled. The adhesive agent 44, adhering the semiconductor chip 20 and the substrate 42, may have heat conductivity. In addition, because the semiconductor chip 20 is cooled, the surface light emitting element 100 coupled to the semiconductor chip 20 is also cooled.

A wiring pattern 48 is provided to the substrate 42. Furthermore, an external terminal 50 is provided to the substrate 42. As for the exemplary embodiment, the external terminal 50 is a lead wire. The wiring pattern 48, provided to the substrate 42, is electrically coupled to the electrodes 22 on the semiconductor chip 20, and at least one of wiring patterns 24 and 64 formed on the semiconductor chip 20 through a wire 52, for example. Furthermore, the wiring pattern 48 may be electrically coupled to the external terminal 50.

The optical fiber 30 is inserted into the hole portion 28 in the semiconductor chip 20. Furthermore, the optical fiber 30 is also inserted and communicated into the hole portion 46 in the substrate 42. The internal diameter of the hole portion 46 becomes gradually smaller toward the hole portion 28 in the semiconductor chip 20. On the surface that is opposite to the semiconductor chip 20, the internal diameter of the opening of the hole portion 46 becomes larger than the diameter of the optical fiber 30. The gap between the optical fiber 30 and the inside surface of the hole portion 46 may be filled with filling material 54 such as resin. The filling material 54 also has a function to fix the optical fiber 30 and to reduce the likelihood or prevent it from being pulled out.

The optical fiber 30 may be a single-mode fiber or a multi-mode fiber. When the surface light emitting element 100 emits the multi-mode light, by using the optical fiber 30 as a multi-mode fiber, the light emitted from the surface light emitting element 100 can be reliably entered to the optical fiber 30.

Furthermore, as for the optical module according to the exemplary embodiment, the surface light emitting element 100 and the semiconductor chip 20 are sealed with resin 56. The resin 56 also seals the electrical coupling between the surface light emitting element 100 and the semiconductor chip 20, and the electrical coupling between the semiconductor chip 20 and the wiring pattern 48, provided to the substrate 42.

Fifth Exemplary Embodiment

Figure 22:
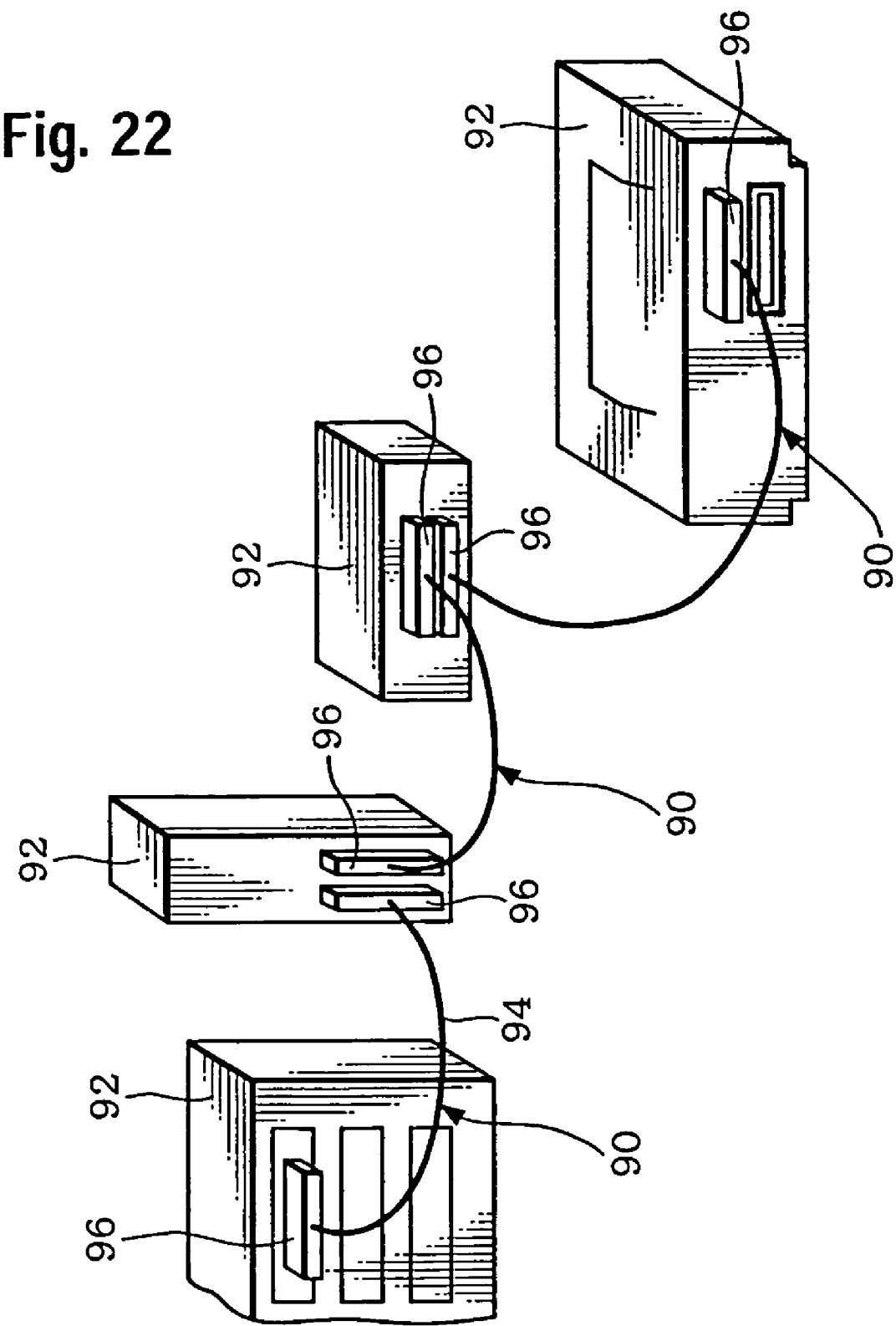
FIG. 22 shows a schematic explaining a light transmission device of a fifth exemplary embodiment according to the present invention.

FIG. 22 shows a schematic explaining a light transmission device according to a fifth exemplary embodiment applying the present invention. A light transmission device 90 mutually couples electronic devices 92, such as computer, display, storage device and printer. The electronic device 92 may be an information communication device. The light transmission device 90 may be a cable 94, whose both ends are provided with plugs 96. The cable 94 includes the optical fiber 30 (refer to FIG. 21). The plug 96 incorporates the surface light emitting element 100 and the semiconductor chip 20. The optical fiber 30 is incorporated into the cable 94, and the surface light emitting element 100 and the semiconductor chip 20 are incorporated into the plug 96. Therefore, they are not shown in FIG. 22. The mounting state of the optical fiber 30 and the surface light emitting element 100 is the same as described in the fourth exemplary embodiment.

One end of the optical fiber 30 is provided with the surface light emitting element 100 according to the first exemplary embodiment. The other end of the optical fiber 30 is provided with a light receiving element (not shown). The light receiving element converts an input optical signal into an electrical signal, and then, inputs the electrical signal into one of the electronic devices 92. An electrical signal output from the electronic devices 92 is converted into an optical signal by the surface light emitting element 100. The optical signal is transmitted through the optical fiber 30 and inputted into the light receiving element.

As described above, according to the light transmission device 90 of the exemplary embodiment, information transmission between the electronic devices 92 can be performed by the optical signal.

Sixth Exemplary Embodiment

Figure 23:
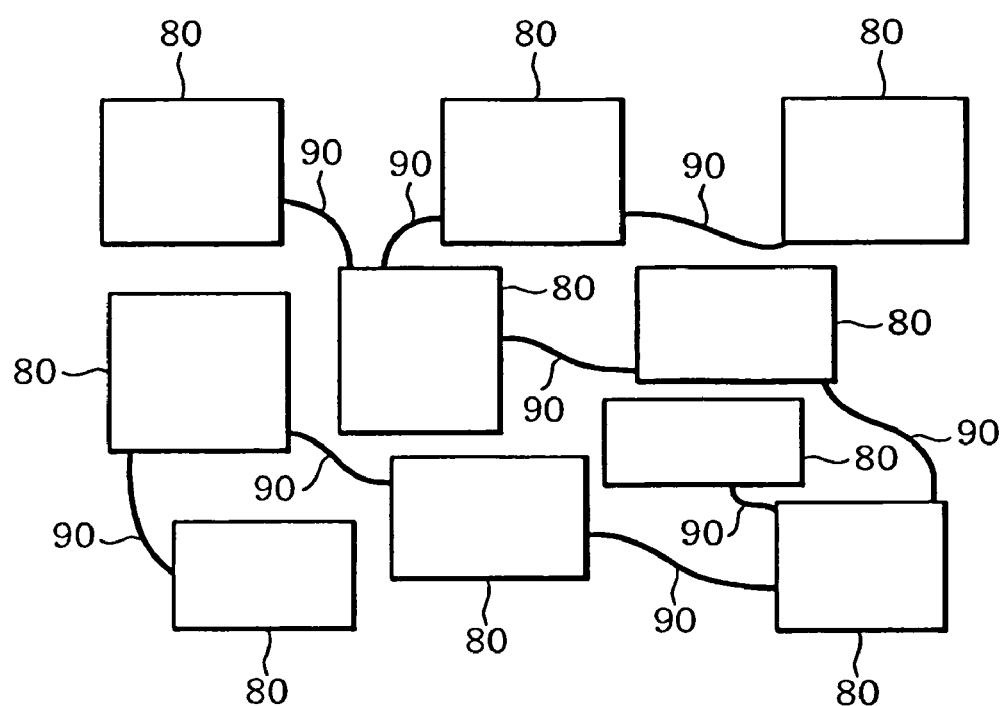
FIG. 23 shows a schematic explaining a usage configuration of a light transmission device of a sixth exemplary embodiment according to the present invention.

FIG. 23 shows a view showing a usage configuration of a light transmission device according to a sixth exemplary embodiment applying the present invention. The light transmission device 90 is coupled between electronic devices 80. As for the electronic devices 80, a liquid crystal display monitor, a CRT adapted to digital technology (It may be used in fields of financing, mail-order, medical service and education), a liquid crystal projector, a plasma display panel (PDP), a digital TV, a cash register in retail shop (POS: Point of Sale Scanning), a video, a tuner, a game device, a printer or the like can be listed.

The present invention is not limited to the above-described exemplary embodiments, but various modifications can be made. For example, an aspect of the present invention includes substantially similar configurations (for example, a configuration of same functions, methods and results, and a configuration of same purposes and results) as described in the exemplary embodiments. Furthermore, the present invention includes configurations, in which non-essential parts of the configurations described in the exemplary embodiments are replaced. Furthermore, the present invention includes configurations, in which similar effects are obtained and same objects are achieved as in the configurations described in the above exemplary embodiments. Furthermore, aspects of the present invention includes configurations, in which related art is added to the configurations described in the embodiments.

For example, as for the above-described exemplary embodiments, a surface light emitting element having one columnar part has been described. However, even if a plurality of columnar parts are provided in the substrate, the exemplary embodiments of the present invention are not affected. Furthermore, even if a plurality of surface light emitting elements are arrayed, the same effects are obtained.

Furthermore, for example, as for the above-described exemplary embodiments, exchanging the p-type and the n-type in each semiconductor layer does not depart from the spirit of the present invention. As for the above-described exemplary embodiments, configurations using AlGaAs have been described, however, other materials, for example, semiconductor materials such as GaInP, ZnSSe, InGaN, AlGaN, InGaAs, GaInNAs and GaAsSb can be used.

What is claimed is:

1. A surface light emitting element, comprising:
a light emitting element part, formed above a semiconductor substrate and emitting light perpendicularly to the semiconductor substrate;
a light detecting part, formed above the light emitting element part; and
a first electrode and a second electrode, which drive the light detecting part,
the light detecting part, including:
a second contact layer, including:
a second light passage part; and
a second electrode coupling part, extending from the second light passage part,
only the second electrode coupling part of the second contact layer ohmic-contacts with the second electrode,
the second electrode coupling part extending from the second light passage part in a third direction, the second electrode coupling part and the second light passage part extending in a fourth direction, the third direction being opposite to the first direction, the fourth direction being parallel to a second direction, the second electrode coupling part having a length Y' in the fourth direction, the second light passage part having a length X' in the fourth direction, the length Y' being shorter than the length X';
a light absorption layer, formed above the second contact layer; and
a first contact layer, formed above the light absorption layer, the first contact layer, including:
a first light passage part; and
a first electrode coupling part, extending from the first light passage part, the first electrode being formed above the first electrode coupling part of the first contact layer,
the first electrode coupling part extending from the first light passage part in a first direction, the first electrode coupling part and the first light passage part extending in the second direction, the first direction and the second direction being perpendicular, the first electrode coupling part having a length Y in the second direction, the first light passage part having a length X in the second direction, the length Y being shorter than the length X.

2. The surface light emitting element according to claim 1, the first electrode being excluded from the upper surface of the first light passage part.

3. The surface light emitting element according to claim 1, an upper surface of the light detecting part including an emitting surface of the light, and an area of the emitting surface being substantially equal to an area of an upper surface of the first light passage part.

4. The surface light emitting element according to claim 3, the emitting surface being the upper surface of the first light passage part.

5. The surface light emitting element according to claim 1, the second electrode not fully surrounding the light detecting part.

6. The surface light emitting element according to claim 1, the light emitting element part functioning as a surface light emitting semiconductor laser.

7. The surface light emitting element according to claim 1, the light emitting element part and the light detecting part forming a pnpn-structure or an npnp-structure as a whole.

8. The surface light emitting element according to claim 1, the light emitting element part and the light detecting part forming an npn-structure or a pnp-structure as a whole.

9. The surface light emitting element according to claim 1, the light emitting element generating a laser beam in multi-mode.

10. A surface light emitting element according to claim 1, further comprising:
 a first insulating layer, which surrounds a part of the light emitting element part; and
 a second insulating layer on the first insulating layer, which surrounds a part of the light detecting part.

11. An optical module, comprising:
 the surface light emitting element according to claim 1; and
 an optical wave guide.

12. A light transmission device, comprising:
 the surface light emitting element according to claim 1.

13. A surface light emitting element, comprising:
 a light emitting element part, formed above a semiconductor substrate and emitting light perpendicularly to the semiconductor substrate;
 a light detecting part, formed above the light emitting element part;
 a first electrode and a second electrode, which drive the light detecting part; and
 at least a part of a third electrode, which drives the light emitting element part, being further formed above the light emitting element part, the third electrode being formed so as to partly surround the second contact layer, and the first electrode and the second electrode being excluded from a region partly surrounded by the third electrode, and extending perpendicularly above a top surface of the second contact layer,
 the light detecting part, including:
  a second contact layer;
  a light absorption layer, formed above the second contact layer; and
  a first contact layer, formed above the light absorption layer, the first contact layer, including:
   a first light passage part; and
   a first electrode coupling part, extending from the first light passage part, the first electrode being formed above the first electrode coupling part of the first contact layer,
   the first electrode coupling part extending from the first light passage part in a first direction, the first electrode coupling part and the first light passage part extending in a second direction, the first direction and the second direction being perpendicular, the first electrode coupling part having a length Y in the second direction, the first light passage part having a length X in the second direction, the length Y being shorter than the length X.

14. The surface light emitting element according to claim 13, further comprising:
 a fourth electrode, formed above the light emitting element part and driving the light emitting element part,
 the second electrode being formed of the same material as that of the fourth electrode.

15. A surface light emitting element, comprising:
 a light emitting element part, formed above a semiconductor substrate and emitting light perpendicularly to the semiconductor substrate;
 a light detecting part, formed above the light emitting element part;
 a first electrode and a second electrode, which drive the light detecting part; and
 at least a part of a third electrode, which drives the light emitting element part, being further formed above the light emitting element part, the third electrode being formed so as to partly surround the second contact layer, and the first electrode and the second electrode being excluded from a region partly surrounded by the third electrode, and extending perpendicularly above a top surface of the second contact layer,
 the light detecting part, including:
  a second contact layer;
  a light absorption layer, formed above the second contact layer; and
  a first contact layer, formed above the light absorption layer, the first contact layer, including:
   a first light passage part; and
   a first electrode coupling part, extending from the first light passage part, the first electrode being formed above the first electrode coupling part of the first contact layer,
   the first electrode coupling part extending from the first light passage part in a first direction, the first electrode coupling part and the first light passage part extending in a second direction, the first direction and the second direction being perpendicular, the first electrode coupling part having a length Y in the second direction, the first light passage part having a length X in the second direction, the length Y being shorter than the length X,
  the first contact layer being of cylindrical-like shape, having a pseudo-circle cross section being configured by an inner side surface of the third electrode, and having a diameter of the pseudo-circle cross section being approximately equal to that of a cross section diameter of the first light 16. A surface light emitting element, comprising:
 a light emitting element part, formed above a semiconductor substrate and emitting light perpendicularly to the semiconductor substrate;
 a light detecting part, formed above the light emitting element part;
 a first electrode and a second electrode, which drive the light detecting part; and
 at least a part of a third electrode, which drives the light emitting element part, being further formed above the light emitting element part, the third electrode being formed so as to partly surround the second contact layer, and the first electrode and the second electrode being excluded from a region partly surrounded by the third electrode, and extending perpendicularly above a top surface of the second contact layer,
 the light detecting part, including:
 a second contact layer;
 a light absorption layer, formed above the second contact layer; and
 a first contact layer, formed above the light absorption layer, the first contact layer, including:
  a first light passage part; and
  a first electrode coupling part, extending from the first light passage part, the first electrode being formed above the first electrode coupling part of the first contact layer,
  the first electrode coupling part extending from the first light passage part in a first direction, the first electrode coupling part and the first light passage part extending in a second direction, the first direction and the second direction being perpendicular, the first electrode coupling part having a length Y in the second direction, the first light passage part having a length X in the second direction, the length Y being shorter than the length X, the first electrode being formed of the same material as that of the third electrode.

17. A surface light emitting element, comprising:

a light emitting element part, formed above a semiconductor substrate and emitting light perpendicularly to the semiconductor substrate;

a light detecting part, formed above the light emitting element part; and a first electrode and a second electrode, which drive the light detecting part, the light detecting part, including:
  a second contact layer, including:
    a second light passage part; and
    a second electrode coupling part, extending from the second light passage part,
    only the second electrode coupling part of the second contact layer ohmic-contacts with the second electrode,
    the second electrode coupling part extending from the second light passage part in a third direction, the second electrode coupling part and the second light passage part extending in a fourth direction, the third direction being opposite to the first direction, the fourth direction being parallel to a second direction, the second electrode coupling part having a length Y' in the fourth direction, the second light passage part having a length X' in the fourth direction, the length Y' being shorter than the length X';
  a light absorption layer, formed above the second contact layer; and
  a first contact layer, formed above the light absorption layer, the first contact layer, including:
    a first light passage part; and
    a first electrode coupling part, extending from the first light passage part, the first electrode being formed above the first electrode coupling part of the first contact layer,
    the first electrode coupling part extending from the first light passage part in a first direction, the first electrode coupling part and the first light passage part extending in the second direction, the first direction and the second direction being perpendicular, the first electrode coupling part having a length Y in the second direction, the first light passage part having a length X in the second direction, the length Y being shorter than the length X, and
    the first electrode coupling part and the at least one second electrode coupling part disposed along a straight line which passes through a center of the light detecting part, so as to sandwich the light detecting part.

18. A surface light emitting element, comprising:

a light emitting element part, formed above a semiconductor substrate and emitting light perpendicularly to the semiconductor substrate;

a light detecting part, formed above the light emitting element part; and a first electrode and a second electrode, which drive the light detecting part, the light detecting part, including:
  a second contact layer, including:
    a second light passage part, and
    a second electrode coupling part, extending from the second light passage part,
    only the second electrode coupling part of the second contact layer ohmic-contacts with the second electrode,
    the second electrode coupling part extending from the second light passage part in a third direction, the second electrode coupling part and the second light passage part extending in a fourth direction, the third direction being opposite to the first direction, the fourth direction being parallel to a second direction, the second electrode coupling part having a length Y' in the fourth direction, the second light passage part having a length X' in the fourth direction, the length Y' being shorter than the length X';
  a light absorption layer, formed above the second contact layer; and
  a first contact layer, formed above the light absorption layer, including:
    a first light passage part; and
    a first electrode coupling part, extending from the first light passage part, the first electrode being formed above the first electrode coupling part of the first contact layer and extending from only a part of the first light passage part when viewed in plan,
    the first electrode coupling part extending from the first light passage part in a first direction, the first electrode coupling part and the first light passage part extending in the second direction, the first direction and the second direction being perpendicular, the first electrode coupling part having a length Y in the second direction, the first light passage part having a length X in the second direction, the length Y being shorter than the length X.

19. A surface light emitting element, comprising:

a light emitting element part, formed above a semiconductor substrate and emitting light perpendicularly to the semiconductor substrate;

a light detecting part, formed above the light emitting element part; and a first electrode and a second electrode, which drive the light detecting part, the light detecting part, including:
  a second contact layer;
  a light absorption layer, formed above the second contact layer; and
  a first contact layer, formed above the light absorption layer, including:
    a first light passage part; and
    a first electrode coupling part, extending from the first light passage part, the first electrode being formed above the first electrode coupling part of the first contact layer,
    the first electrode coupling part extending from the first light passage part in a first direction, the first electrode coupling part and the first light passage part extending in a second direction, the first direction and the second direction being perpendicular, the first electrode coupling part having a length Y in the second direction, the first light passage part having a length X in the second direction, the length Y being shorter than the length X, the second contact layer including:
  a second light passage part; and
  a plurality of second electrode coupling parts extending from the second light passage part,
  one of the plurality of second electrode coupling parts extending from the second light passage part in a third direction, the one of the plurality of second electrode coupling parts and the second light passage part extending in a fourth direction, the third direction being opposite to the first direction, the fourth direction being parallel to the second direction, the one of the plurality of second electrode coupling parts having a length Y' in the fourth direction, the second light passage part having a length X' in the fourth direction, the length Y' being shorter than the length X',
  a second of the plurality of second electrode coupling parts extending from the second light passage part in a fifth direction, the second of the plurality of second electrode coupling parts and the second light passage part extending in a sixth direction, the fifth direction being different from the first direction and third direction, the sixth direction being different from the second direction and fourth direction, the fifth direction and the sixth direction being perpendicular, the second of the plurality of second electrode coupling parts having a length Y" in the sixth direction, the second light passage part having a length XΔ in the sixth direction, the length YΔ being shorter than the length XΔ.

* * * * *